(12) United States Patent
Uno et al.

(10) Patent No.: US 6,984,864 B2
(45) Date of Patent: Jan. 10, 2006

(54) SEMICONDUCTOR DEVICE WITH MISFET HAVING LOW LEAKAGE CURRENT

(75) Inventors: Tomoaki Uno, Chigasaki (JP); Yoshito Nakazawa, Isesaki (JP)

(73) Assignee: Renesas Technology Corp., Tokyo (JP)

( * ) Notice: Subject to any disclaimer, the term of this patent is extended or adjusted under 35 U.S.C. 154(b) by 113 days.

(21) Appl. No.: 10/463,771

(22) Filed: Jun. 18, 2003

(65) Prior Publication Data

US 2004/0012050 A1    Jan. 22, 2004

(30) Foreign Application Priority Data

Jul. 19, 2002    (JP) .............................. 2002-210882

(51) Int. Cl.
*H01L 29/78*    (2006.01)
(52) U.S. Cl. ...................... 257/382; 257/330; 257/334; 257/341; 257/369; 257/383; 257/384; 257/412; 257/413; 257/757
(58) Field of Classification Search ................ 257/330, 257/334, 341, 369, 382–384, 412, 413, 750, 257/751, 754, 757
See application file for complete search history.

(56) References Cited

U.S. PATENT DOCUMENTS

| 4,914,500 | A | * | 4/1990 | Liu et al. ..................... 257/384 |
| 5,907,789 | A | * | 5/1999 | Komatsu ..................... 438/649 |
| 6,255,692 | B1 | * | 7/2001 | Huang ......................... 257/341 |
| 6,307,231 | B1 | * | 10/2001 | Numazawa et al. ......... 257/330 |

FOREIGN PATENT DOCUMENTS

JP    2001-127072    5/2001

* cited by examiner

*Primary Examiner*—Gene M. Munson
(74) *Attorney, Agent, or Firm*—Miles & Stockbridge PC

(57) ABSTRACT

In an n-channel type power MISFET, a source electrode in contact with an $n^+$-semiconductor region (source region) and a $p^+$-semiconductor region (back gate contact region) is constituted with an Al film and an underlying barrier film comprised of $MoSi_2$, use of the material having higher barrier height relation to n-Si for the barrier film increasing the contact resistance to n-Si and backwardly biasing the emitter and base of a parasitic bipolar transistor making it less tending to turn-on, thereby decreasing the leak current of power MISFET.

38 Claims, 24 Drawing Sheets

FIG. 19

RELATION OF ΦB AND CONTACT RESISTANCE TO n-SILICON

| BARRIER METAL | EQUIVALENT METAL-SEMICONDUCTOR COMBINATION | ΦB | CONTACT RESISTANCE |
|---|---|---|---|
| TiW | W–nSi | 0.65V | CONTACT RESISTANCE LOW TO n-SILICON<br>CONTACT RESISTANCE HIGH TO p-SILICON |
| MoSi2 | MoAL12–nSi | 0.70V | CONTACT RESISTANCE HIGH TO n-SILICON<br>CONTACT RESISTANCE LOW TO p-SILICON |

FIG. 30

METAL OF HIGHER BARRIER
HEIGHT TO N-SILICON THAN TiW

| METAL-SEMICONDUCTOR COMBINATION | $\Phi B(V)$ |
|---|---|
| W-Si (BARRIER METAL IS TiW) | 0.65 |
| Co-Si | 0.64 ~ 0.68 |
| Ni-Si | 0.66 ~ 0.75 |
| Rh-Si | 0.69 |
| MoAl$_{12}$-Si (BARRIER METAL IS MoSi$_2$) | 0.7 |
| Pb-Si | 0.72 ~ 0.75 |
| Mn-Si | 0.72 ~ 0.76 |
| Pt-Si | 0.84 |
| Ir-Si | 0.93 |

FIG. 31

METAL OF LOWER BARRIER
HEIGHT TO N-SILICON THAN TiW

| METAL-SEMICONDUCTOR COMBINATION | $\Phi B(V)$ |
|---|---|
| W-Si (BARRIER METAL IS TiW) | 0.65 |
| Co-Si | 0.64 ~ 0.68 |
| Ti-Si (BARRIER METAL IS TiN) | 0.6 |
| Ta-Si | 0.59 |
| Cr-Si | 0.57 |
| Mo-Si | 0.55 |
| Zr-Si | 0.55 |
| Hf-Si | 0.53 |

T1, T3 : SOURCE
T2, T4 : GATE
T5, T6, T7, T8 : DRAIN

SEMICONDUCTOR DEVICE WITH MISFET HAVING LOW LEAKAGE CURRENT

BACKGROUND OF THE INVENTION

The present invention concerns a semiconductor device and, more in particular, it relates to a technique which is effective to be applied to a semiconductor device having a power MISFET (Metal Insulator Semiconductor Field Effect Transistor).

Transistors that can be used for high power application of several watts or higher are referred to as power transistors, for which various structures have been studied.

Among them, power MISFETs includes those referred to as a vertical type and lateral type and they are classified structure, for example, into a trench type and planer type in accordance with the structure of a gate portion.

The MISFET described above has a structure in which plural MISFETs each of a fine pattern are connected (for example, by the number of several thousands) in parallel in order to cope with high power.

Barrier films (barrier metal films) are formed to connection portions with wirings or semiconductor substrates for preventing formation of undesired reaction layers or deposition of underlayer material caused by the contact of material constituting them.

For example, Japanese Patent Laid-Open No. 2001-127072 discloses a technique of forming titanium tungsten between source wirings (15) and a semiconductor substrate (1S) of a power MISFET.

SUMMARY OF THE INVENTION

The present inventors have been now under research and development for semiconductor devices, particularly, power MISFETs.

In such a power MISFET, it has been studied for refinement of elements, for example, reduction of the width of a trench to which a gate portion is formed since it us necessary to decrease on-resistance (Ron), gate capacitance (Qg) and gate drain capacitance (Qgd).

That is, for decreasing the on-resistance, it is necessary to increase the channel width per unit area and the channel width per unit area can be increased by decreasing the width of the trench to which the gate portion is formed. Further, when the width of the trench to which the gate portion is formed is decreased, an opposing area between the gate portion and the drain portion at the rear face of a substrate can be made smaller to decrease the capacitance (Qgd).

On the other hand, while power MISFETs have various application uses, severe standards for IDSS (leak current between source and drain when a voltage is applied to the drain at a 0 V state between gate and source) have been imposed to many devices used for measuring instruments. Examples of devices used for measuring instruments include those products in which light emitting devices (LED), photoelectronic devices (solar cells) and power MISFET are formed into one package.

In power MISFET used for the products described above, it is an essential condition that the leak current (IDSS) is low, for example, with the reason that it gives undesired effects on the measured value.

However, when the present inventors have made a study by decreasing the width of the trench to which the gate portion is formed for the refinement of the element, for example, by reducing the trench width from 0.8 $\mu$m to 0.5 $\mu$m, it has been observed a phenomenon that IDSS increased by about one digit.

The present invention intends to decrease a leak current of a semiconductor device, particularly, a power MISFET.

The invention also intends to improve the characteristics of a semiconductor device, particularly, a semiconductor device having power MISFET.

The foregoing and other objects and the novel features of the invention will become apparent by referring to the descriptions of the present specification and appended drawings.

Among the inventions disclosed in the present application, the outline of typical inventions will be described briefly below.

The semiconductor device of the invention comprises (a) an MISFET formed in a semiconductor substrate, including:

(a1) a gate portion comprising a first conductor formed on the surface of the semiconductor substrate;

(a2) a source portion comprising semiconductor region of a first conduction type on the surface of the semiconductor substrate and in the semiconductor substrate at the end of the gate portion;

(a3) a drain portion comprising a semiconductor region of the first conduction type; and (a4) a channel portion arranged between the source portion and the drain portion, and (b) a conductive portion formed above the semiconductor substrate and in contact with the source portion and the channel portion (semiconductor region of the second conduction type), including:

(b1) a second conductor; and (b2) a third conductor arranged between the second conductor and the semiconductor substrate, wherein the contact resistance between the source portion and the conductive portion is higher than the contact resistance between channel portion and the conductive portion.

The third conductor described above is formed of molybdenum silicide, for example, in a case where the first conduction type is an n-type.

Further, in a case where the first conduction type of the semiconductor device is an n-type, a barrier height between the n-semiconductor and the third conductor may be higher than a barrier height between the n-semiconductor and titanium tungsten.

BRIEF DESCRIPTION OF THE DRAWINGS

FIG. 19 is a table showing a relation between the value for barrier height ΦB to n-silicon and a contact (ohmic) resistance;

FIG. 30 is a table showing barrier height ΦB for various kinds of metals to n-Si, which is for metals of higher barrier height ΦB than TiW;

FIG. 31 is a table showing barrier height ΦB for various kinds of metals to n-Si, which is for metals of lower barrier height ΦB than TiW;

DETAILED DESCRIPTION OF THE PREFERRED EMBODIMENTS

Figure 1:
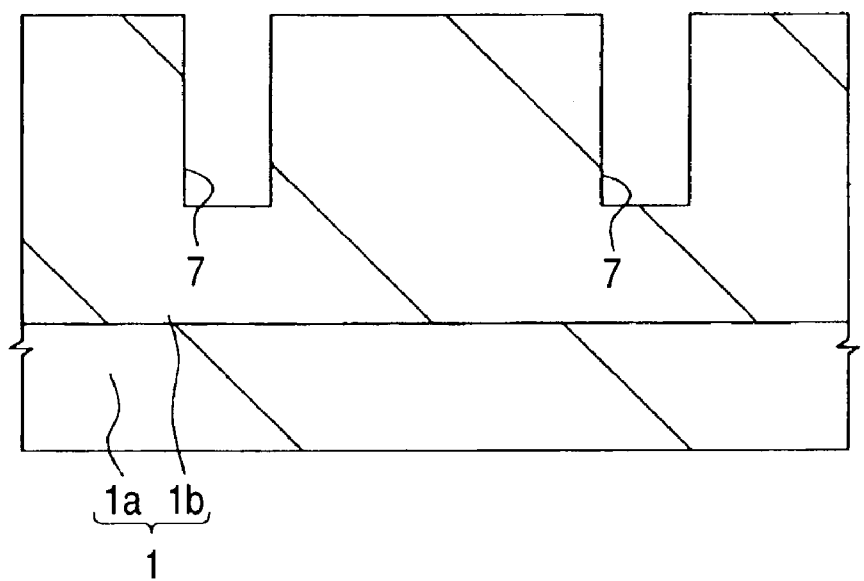
FIG. 1 is a cross sectional view for a main portion of a substrate showing a method of manufacturing a semiconductor device of Embodiment 1 according to the invention.

Preferred embodiments of the present invention are to be described with reference to the drawings. Throughout the drawings for explaining the preferred embodiments, those having identical functions carry identical reference numerals for which duplicate description will be omitted.

(Embodiment 1)

A semiconductor device according to this embodiment is to be described in accordance with a manufacturing method thereof.

FIG. 1 to FIG. 11 are cross sectional views for a main portion or plan views for a main portion of a substrate showing a method of manufacturing a semiconductor device according to this embodiment.

At first, as shown in FIG. 1, a semiconductor substrate 1 in which a single crystal silicon layer 1b doped with an n-impurity (for example, phosphorus) is epitaxially grown on the surface of an n-single crystal silicon substrate 1a (hereinafter simply referred to as "substrate") is provided.

Figure 2:
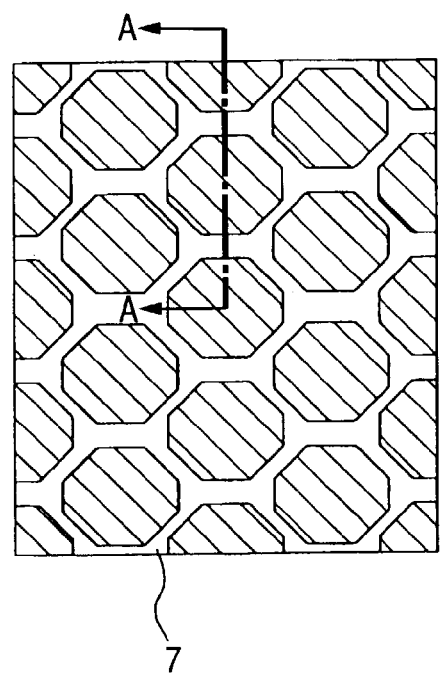
FIG. 2 is a plan view for a main portion of a substrate showing a method of manufacturing a semiconductor device of Embodiment 1 according to the invention.

Then, the substrate 1 is etched to form trenches 7 by using a film patterned by using photolithography (not illustrated) as a mask. FIG. 2 shows an example of a pattern for the trenches 7. As shown in the drawing, trenches 7 are arranged so as to surround the periphery of plural octagonal patterns. The width of the trench 7 is, for example, about 0.5 μm. FIG. 1 corresponds, for example, to A—A cross section in FIG. 1.

Figure 3:
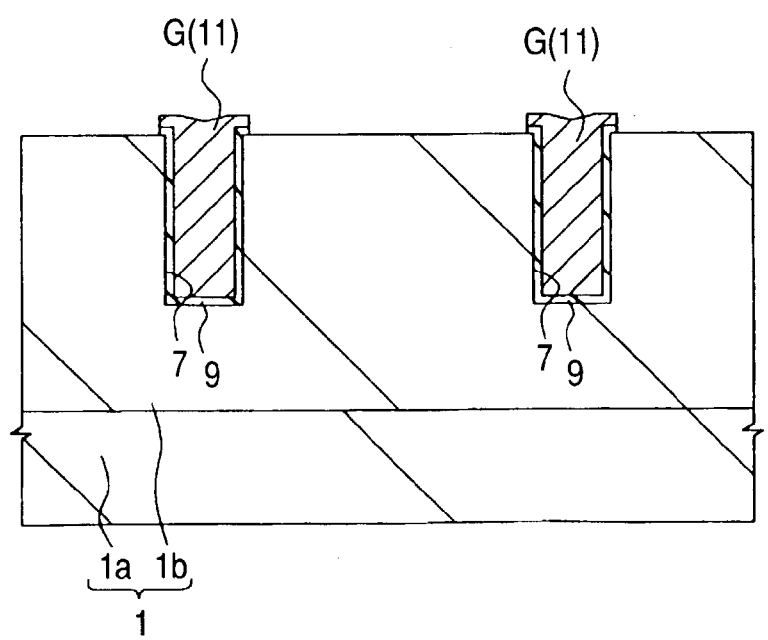
FIG. 3 is a cross sectional view for a main portion of a substrate showing a method of manufacturing a semiconductor device of Embodiment 1 according to the invention.

Then, as shown in FIG. 3, a heat treatment is applied to the substrate 1 to form a thermal oxide film 9 to the bottom and the side of the trenches 7. The thermal oxide film 9 forms a gate dielectric film for a power MISFET. Then, a polycrystal silicon film 11 of low resistance doped with an impurity is deposited to an extent of burying the trenches 7. In this process, the polycrystal silicon film 11 is deposited in a layerous form at the periphery of a device forming region not formed with the trench.

Figure 4:
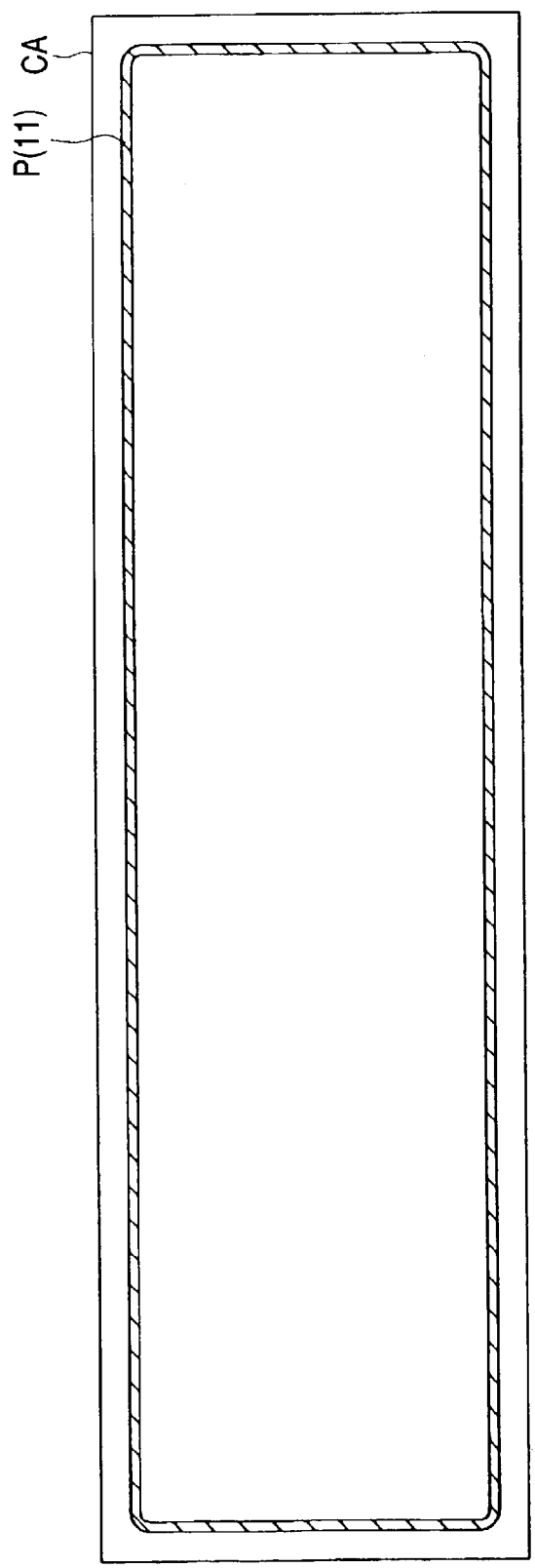
FIG. 4 is a plan view for a main portion of a substrate showing a method of manufacturing a semiconductor device of Embodiment 1 according to the invention.

Then, the polycrystal silicon film 11 is etched by using a not illustrated photoresist film (hereinafter simply referred to as "resist film") as a mask to leave the polycrystal silicon film 11 in the trenches 7. The polycrystal silicon film 11 in the trench forms a gate portion G of a power MISFET. In this process, as shown in FIG. 4, a polycrystal silicon film pattern P is formed at the periphery of the device forming region. The pattern P is connected with the gate portion G at the periphery of the device forming region. CA denotes a chip region.

Figure 5:
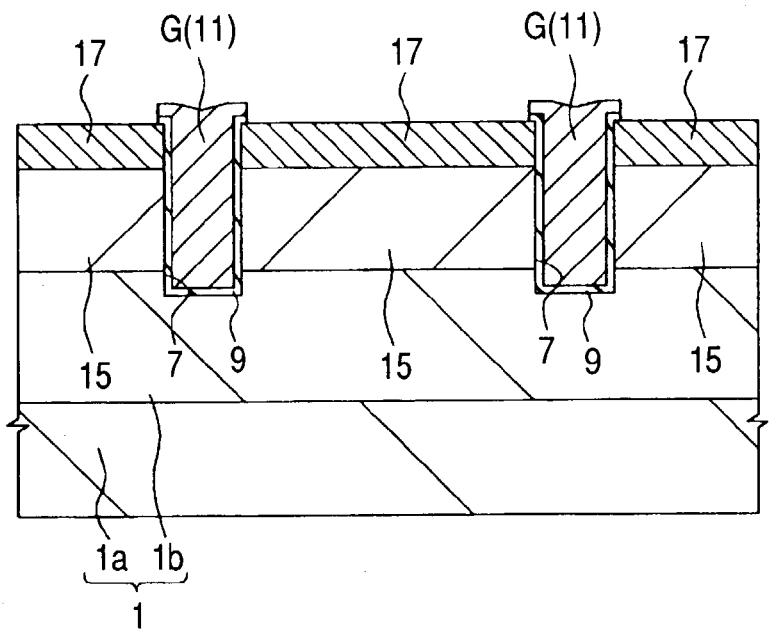
FIG. 5 a cross sectional view for a main portion of a substrate showing a method of manufacturing a semiconductor device of Embodiment 1 according to the invention.

Then, as shown in FIG. 5, using a not illustrated resist film as a mask, a p-impurity is implanted and diffused into the substrate 1 between the trenches 7 to form a p$^-$-semiconductor region (channel region, well) 15. The bottom of the trench 7 is at a position deeper than the p$^-$-semiconductor region 15.

Then, with a not illustrated resist film as a mask, an n-impurity (for example, As) is implanted into the substrate 1 between the trenches 7 to form an n$^+$-semiconductor region (source region) 17. The n$^+$-semiconductor region (source region) 17 is formed in the plural octagonal pattern regions shown in FIG. 2. Further, the bottom of the n$^+$-semiconductor 17 is in the p$^-$-semiconductor region 15.

Figure 6:
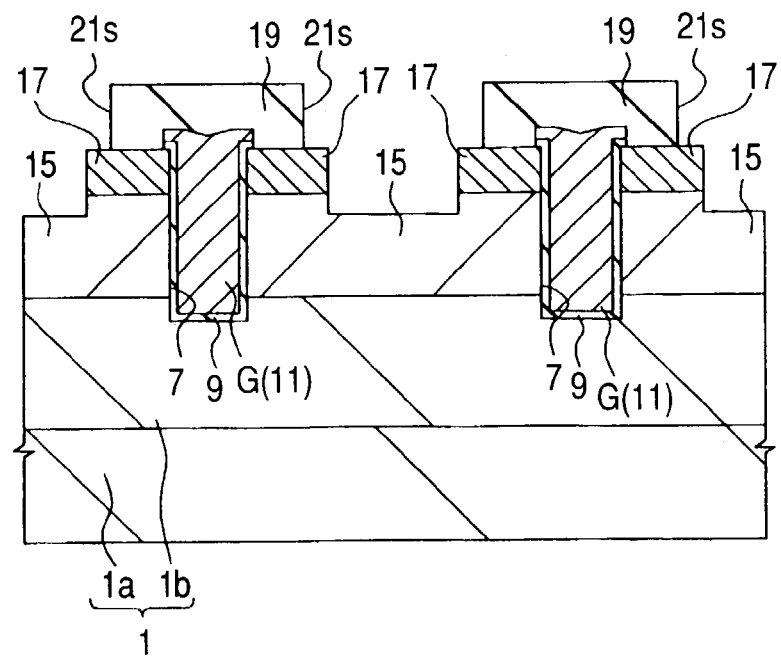
FIG. 6 a cross sectional view for a main portion of a substrate showing a method of manufacturing a semiconductor device of Embodiment 1 according to the invention.
Figure 7:
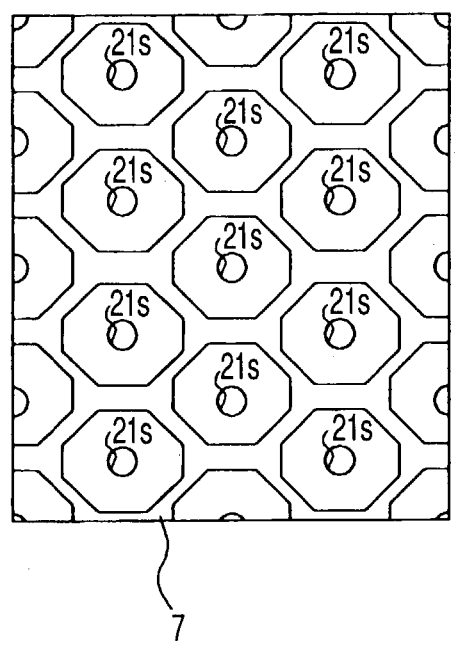
FIG. 7 is a plan view for a main portion of a substrate showing a method of manufacturing a semiconductor device of Embodiment 1 according to the invention.

Then, as shown in FIG. 6 and FIG. 7, after forming a silicon oxide film 19 above the substrate 1, the substrate 1 (p$^-$-semiconductor region 15 and the n$^+$-semiconductor region 17) in the plural octagonal patterns (on n$^+$-semiconductor region 17) is etched by using a not illustrated resist film as a mask to form contact trenches (source contact) 21s. In this case, etching condition is controlled such that the diameter for the opening of the substrate 1 (17, 15) is smaller than the diameter for the opening of the silicon oxide film 19.

The n$^+$-semiconductor region 17 is exposed from the lateral wall of the contact trench 21s and the p$^-$-semiconductor region 15 is exposed from the bottom thereof. In other words, the depth of the contact trench 21s exceeds the n$^+$-semiconductor region 17 and reaches as far as the p$^-$-semiconductor region 15.

Further, although not illustrated, the silicon oxide film 19 above the polycrystal silicon film pattern P is removed to form a contact trench (gate contact).

Figure 8:
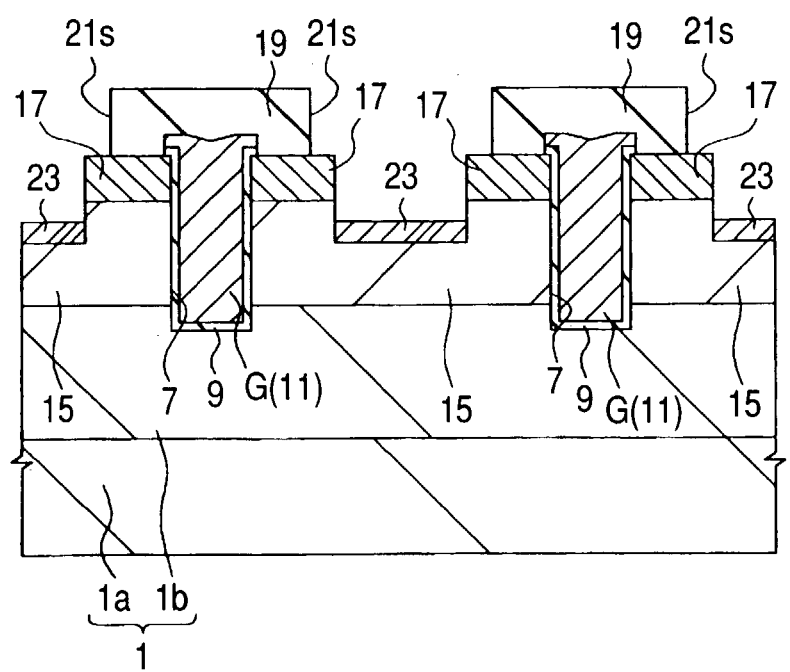
FIG. 8 is a cross sectional view for a main portion of a substrate showing a method of manufacturing a semiconductor device of Embodiment 1 according to the invention.

Then, as shown in FIG. 8, a p-impurity, for example, boron fluoride (BF$_2$) is implanted to the bottom of the contact trench 21s and diffused to form a p$^+$-semiconductor region (back gate contact region) 23. That is, the source electrode formed on the contact trench 21s is connected with the source region 17, and connected with the back gate by way of the p$^+$-semiconductor region 23.

By forming the contact trench 21s and disposing the p$^+$-semiconductor region 23 at the bottom thereof as described above, mask alignment margin can be decreased to refine the portion between the gates.

Figure 12:
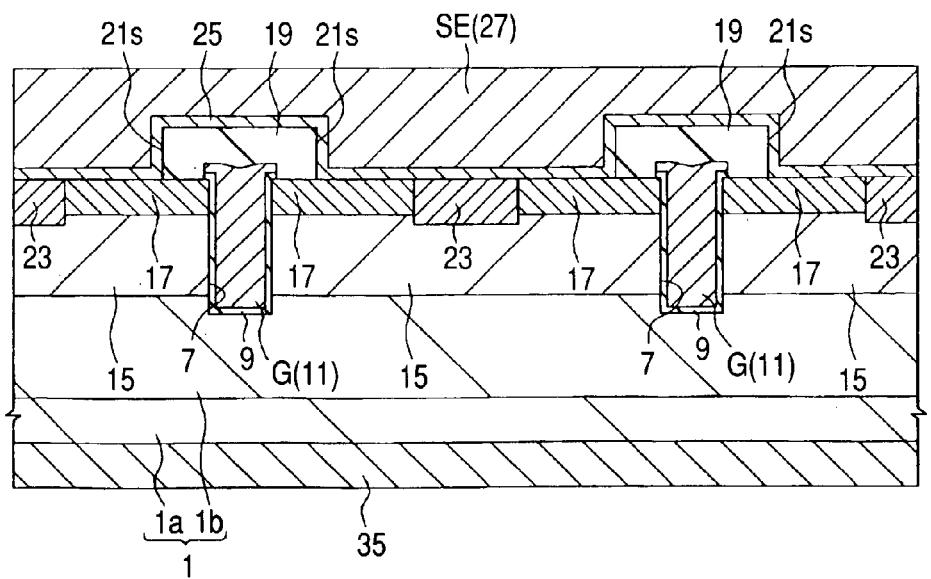
FIG. 12 is a cross sectional view for a main portion of a substrate showing a semiconductor device for comparison with the semiconductor device according to Embodiment 1 of the invention.

For example, as shown in FIG. 12, it is also possible to form a p$^+$-semiconductor region 23 on the surface of the substrate.

Figure 13:
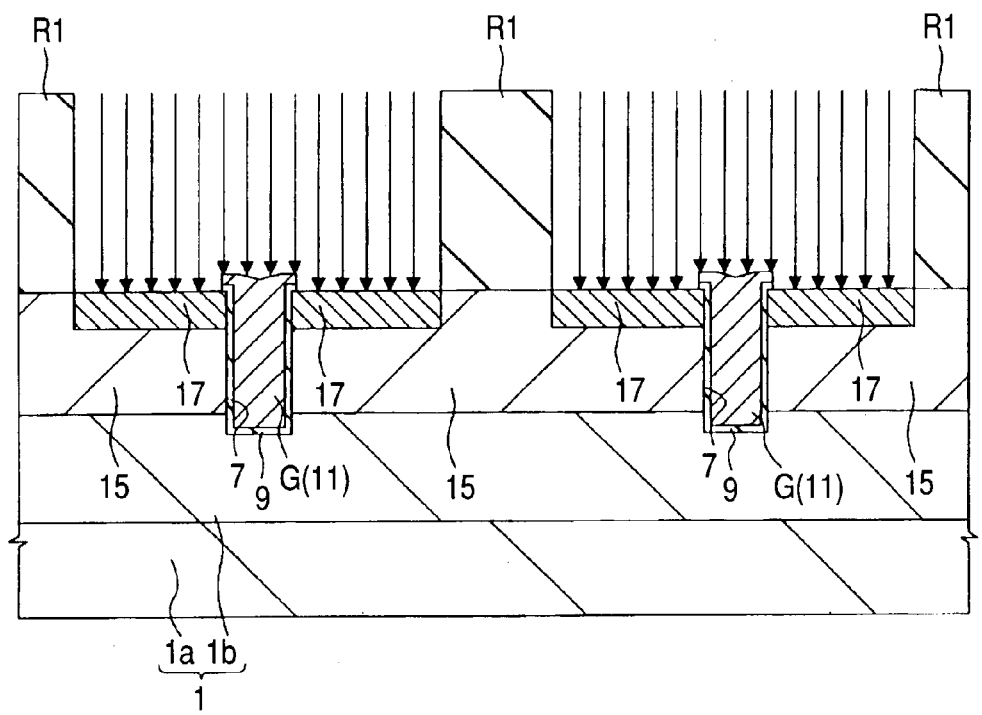
FIG. 13 is a cross sectional view for a main portion of a substrate showing a method of manufacturing a semiconductor device for comparison with the semiconductor device according Embodiment 1 of the invention.

In this case, however, as shown in FIG. 13, after at first forming a p$^-$-semiconductor region (channel region) 15, a resist film R1 is formed on a portion between the gate portions G (plural hexagonal patterns) so as to cover the region for forming the p$^-$-semiconductor region 15. Then, an n-impurity (for example, arsenic) is implanted and diffused to form an n$^-$-semiconductor region 17 by using the resist film R1 as a mask.

Figure 14:
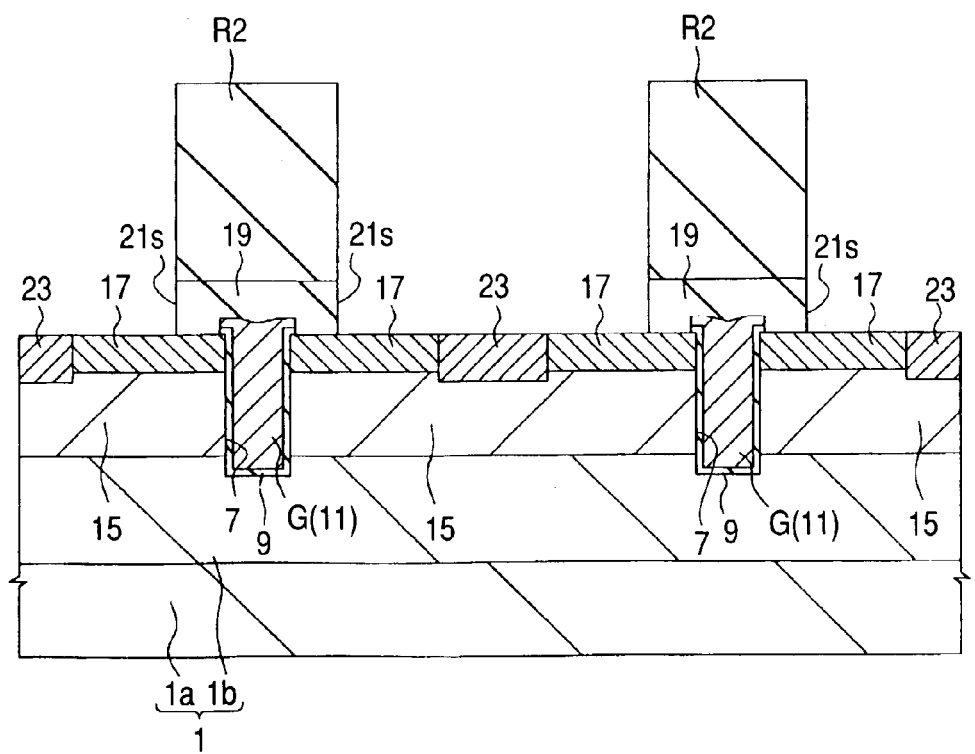
FIG. 14 is a cross sectional view for a main portion of a substrate showing a method of manufacturing a semiconductor device for comparison with the semiconductor device according Embodiment 1 of the invention.

Further, as shown in FIG. 14, after forming a silicon oxide film 19 above the substrate 1, contact trenches (source contact) 21s are formed by using a resist film R2 having an opening above a portion between the n$^+$-semiconductor regions 17 as a mask and, further, a p-impurity, for example, boron fluoride (BF$_2$) is implanted and diffused into the openings to form p$^+$-semiconductor regions 23.

Figure 15:
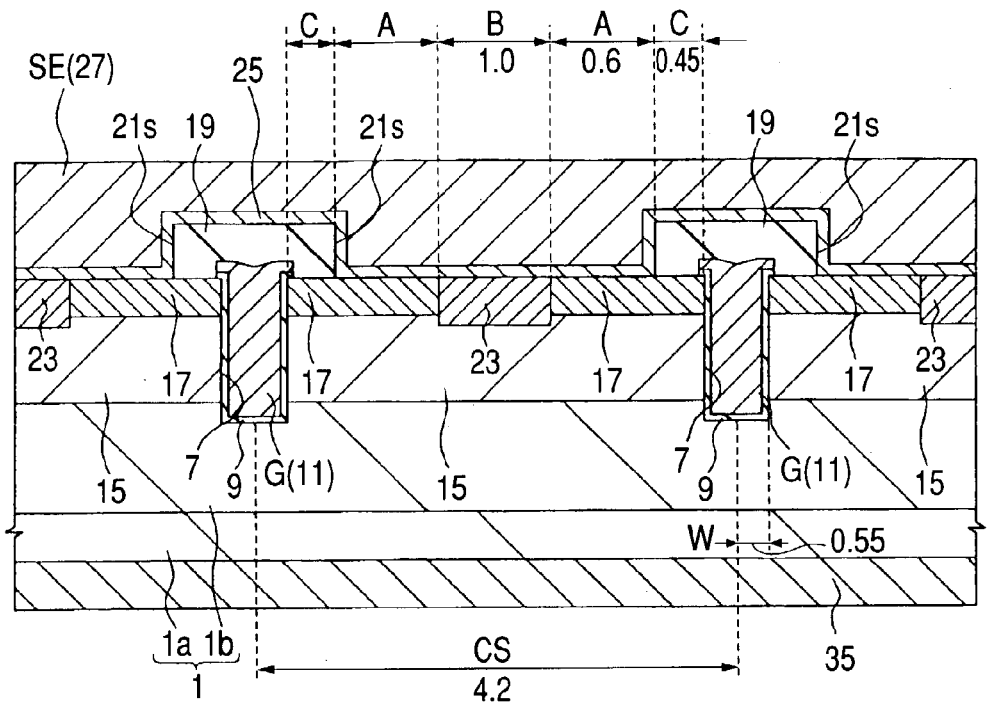
FIG. 15 is a cross sectional view for a main portion of a substrate showing a method of manufacturing a semiconductor device for comparison with the semiconductor device according Embodiment 1 of the invention.

As described above, in the structure shown in FIG. 12, mask alignment is applied twice, so that mask alignment or the like has to be taken into consideration and refinement of the device is difficult. FIG. 15 shows an example for distance between each of the portions. In the drawing, are shown a barrier film 25, a source electrode SE comprising an aluminum film 27, and a conductive film 35 forming a drain electrode.

Portion A indicates a distance between the end of the contact trench 21s and the end of the n$^+$-semiconductor region 17, and it requires a distance of about 0.6 µm in view of the alignment accuracy between each of the three layers, i.e., the gate portion G, the n$^+$-semiconductor region 17 and the contact trench 21s.

Further, as the portion between the gate portions is refined, the width of the resist film R1 for instance (refer to FIG. 13) is decreased and, in a case where the width is 1.0 µm or less, peeling of the resist film occurs making it impossible to implant the impurity to desired regions. Accordingly, about 1.0 µm is necessary for the portion B (width of the p$^+$-semiconductor region 23).

Further, portion C is a distance between the end of the gate portion C and the end of the contact trench 21s, and the distance of 0.45 µm or more is necessary in order to prevent short circuit between the gate portion G and the source electrode SE in the contact trench 21s.

Accordingly, the cell size in this case is 4.2 µm. The cell size CS is defined as a center-to-center distance for the adjacent gate portions G, that is, the sum for the width of the trench 7 (1.1 µm in FIG. 15) and the distance of portion A, portion B and portion C.

Figure 16:
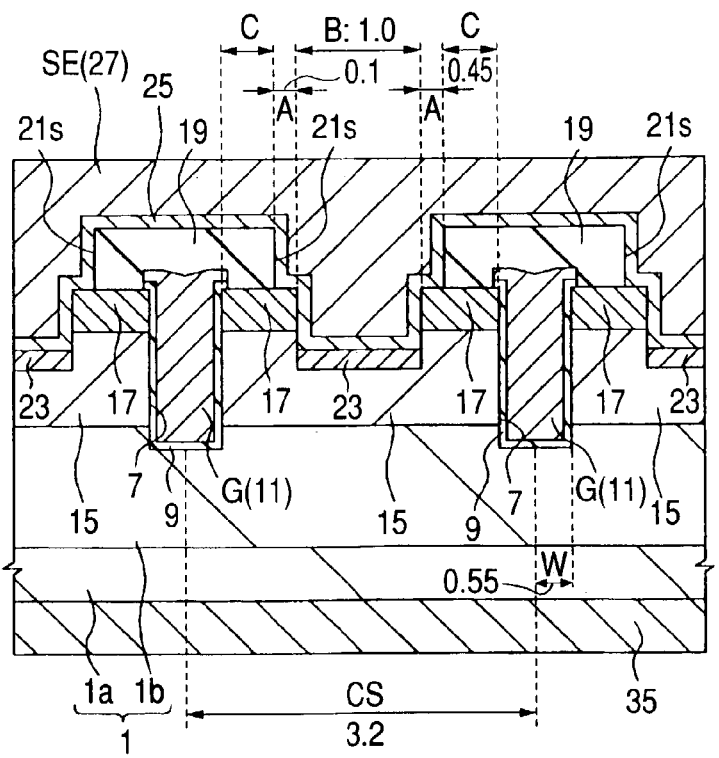
FIG. 16 is a cross sectional view for a main portion of a substrate showing the semiconductor device according to Embodiment 1 of the invention.

Accordingly, in a case of decreasing the cell size, for example, to 3 µm or less, it is necessary to adopt a structure shown in FIG. 16.

Figure 17:
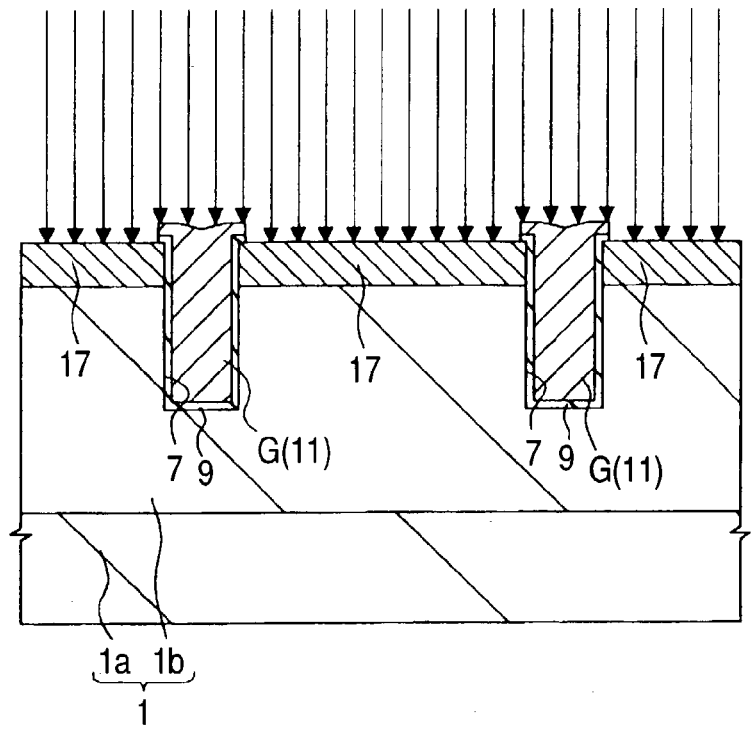
FIG. 17 is a cross sectional view for a main portion of a substrate showing a method of manufacturing the semiconductor device according to Embodiment 1 of the invention.

In this case, it is not necessary to form the resist film R1 to a portion between the gate portions G in order to cover the region for forming the p$^-$-semiconductor region 15 as shown in FIG. 17. That is, the impurity can be implanted for the entire cell region. That is, only the mask alignment error upon forming the contact trench 21 has to be taken into consideration for the mask alignment error. Accordingly, as shown in FIG. 16, the portion A can be decreased to about 0.1 µm, and the portion B can also be decreased within such a range as enabling connection with the substrate. A distance of 0.45 µm or more is necessary for the portion C in order to prevent short circuit between the gate portion G and the source electrode SE.

In this case, also in a case of ensuring the portion B by about 1.0 µm in order to decrease the connection resistance, the cell size can be refined as about 3.2 µm.

Figure 9:
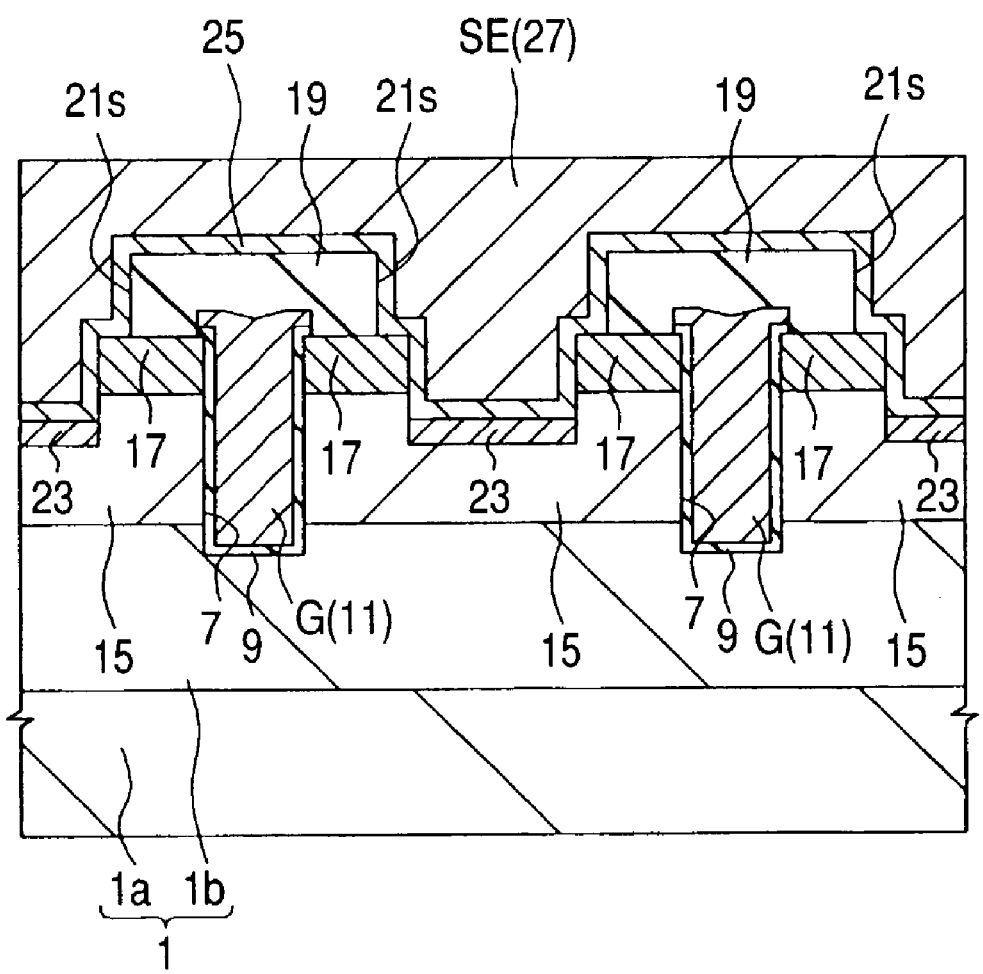
FIG. 9 a cross sectional view for a main portion of a substrate showing a method of manufacturing a semiconductor device of Embodiment 1 according to the invention.

Then, as shown in FIG. 9, a molybdenum silicide (MoSi$_2$) film 25 is deposited as a barrier film by about 60 nm on the silicon oxide film 19 including the inside of the contact trench 21s, for example, by sputtering.

Successively, an aluminum (Al) film 27, for example, is deposited as a conductive film to about 5 μm by sputtering. The barrier film is formed for preventing silicon in the substrate 1 from depositing into the Al film 27. The Al film may comprise Al as a main ingredient and it may also contain other metals.

Figure 10:
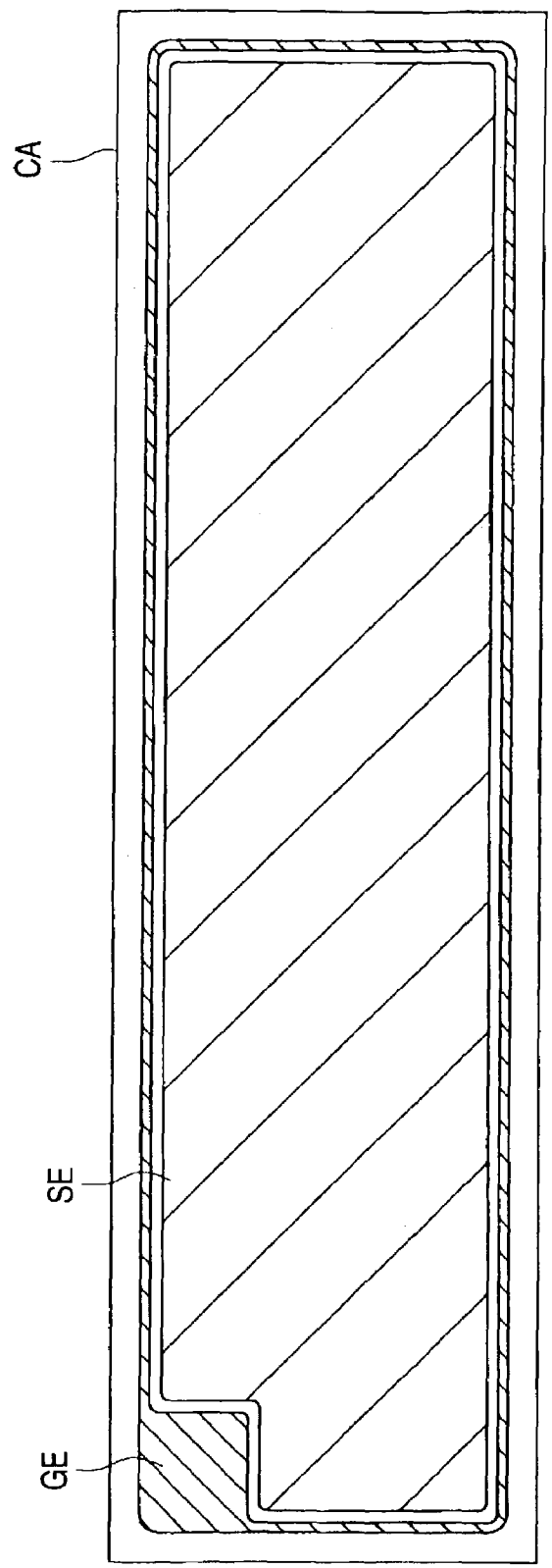
FIG. 10 is a plan view for a main portion of a substrate showing a method of manufacturing a semiconductor device of Embodiment 1 according to the invention.

Then, the $MoSi_2$ film 25 and the Al film 27 are etched by using a not illustrated resist film as a mask to form a gate electrode (gate lead electrode) GE and a source electrode (source lead electrode) SE. The electrodes (GE, SE) form first layer wirings. FIG. 10 is an example for the pattern of the gate electrode GE and the source electrode SE.

Figure 11:
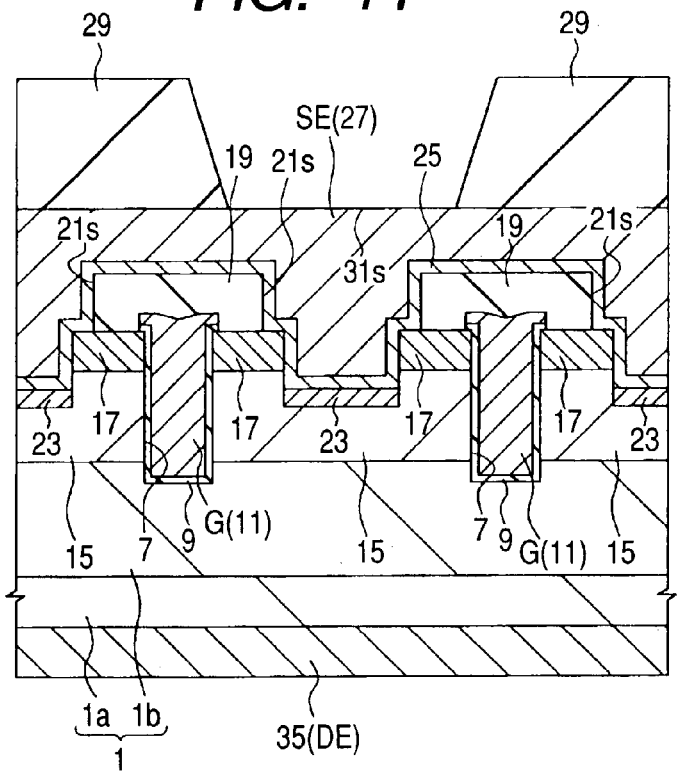
FIG. 11 is a cross sectional view for a main portion of a substrate showing a method of manufacturing a semiconductor device of Embodiment 1 according to the invention.

Then, as shown in FIG. 11, a protection film, for example, a polyimide film 29 is coated above the substrate 1, and the polyimide film on the gate electrode GE and the source electrode SE are removed by exposure and development to form an opening (pad portion). FIG. 11 shows an opening 31s on the source electrode SE.

Then, after protecting the surface of the substrate 1 by a tape or the like, the rear face of the substrate 1 is ground with the protection surface being on the lower side. Then, for example, an Ni (nickel) film, a Ti (titanium) film and a gold (Au) film are formed as conductive film successively on the rear face (1a) of the substrate 1 by sputtering to form a stacked film 35 thereof. The stacked film 35 forms a lead electrode (drain electrode DE) for the drain (1a, 1b).

Then, the tape is peeled and the substrate 1 in the state of a wafer is subject to dicing, for example, along the chip region CA, individual chips are mounted on the side of the electrode DE thereof on a lead frame (mounting plate), for example, having an external terminals, and the external terminals and the gate electrode GE and the source electrode SE exposed from the pad portion are connected by utilizing gold wires or bumps. Then, the periphery of the chip is sealed by a resin or the like.

As a result, a semiconductor device having an n-channel type power MISFET is completed. The completed figure is not illustrated.

As described above according to this embodiment, since the barrier film of the n-channel type power MISFET is constituted with $MoSi_2$, IDSS (leak current between drain and source when a voltage is applied to the drain in a state where voltage between gate and source is 0 V) can be decreased. Further the avalanche resistance amount can be improved.

The reason capable of obtaining the effects described above is to be explained below.

(1) The effect of decreasing IDSS (leak current) is to be described. Description is to be made at first to a case studied on the barrier material before adopting $MoSi_2$ made by the present inventors.

Figure 18:
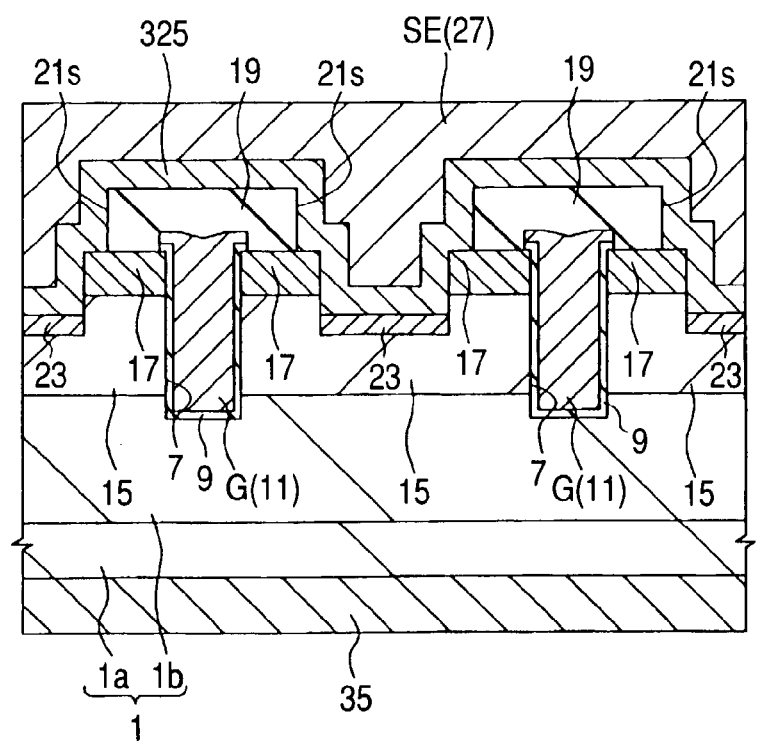
FIG. 18 is a cross sectional view for a main portion of a substrate showing a semiconductor device for comparison with the semiconductor device according Embodiment 1 of the invention.

The present inventors studied for the adoption of titanium tungsten (TiW) film as the barrier material. However, in a case of using a TiW film 325 as a barrier film as shown in FIG. 18 for example, IDSS was increased by about one digit compared with the device of the structure shown in FIG. 12. The thickness of the TiW film in this case was about 150 to 200 nm.

As described above, the channel width per unit area is increased by the refinement of the cell. Accordingly, while increase of IDSS was expected naturally, since IDSS increased remarkably exceeding the increment of the channel width, constitution and the material for each of the portions were studied. As a result, IDSS could be decreased successfully by using $MoSi_2$ as described previously.

This is considered to be attributable to that, in a case of using $MoSi_2$ as the barrier film, $MoAl_{12}$ as a compound (reaction product) of Al as an upper layer and Mo (molybdenum) is formed at the boundary with the substrate 1 (Si: silicon).

The barrier height ΦB for $MoAl_{12}$ and n-Si is about 0.65 V. In a case where a metal and a semiconductor are in contact with each other, the barrier height ΦB means a potential barrier at the boundary therebetween.

On the other hand, in a case of using TiW with a higher W (tungsten) constitutional ratio as a barrier film, it is considered that the barrier height ΦB is equivalent with barrier height ΦB for W and n-Si which is about 0.70 V.

FIG. 19 shows a relation between the value for the barrier height ΦB and the contact resistance. As illustrated, contact resistance to n-Si is higher in a case of using $MoSi_2$ compared with a case of using TiW and, on the other hand, the contact resistance to n-Si is lower in a case of using TiW compared with a case of using $MoSi_2$.

The relation described above is reversed with respect to p-Si, i.e., the contact resistance to p-Si is lower in a case of using $MoSi_2$, while the contact resistance to p-Si is higher in a case of using TiW.

Figure 20:
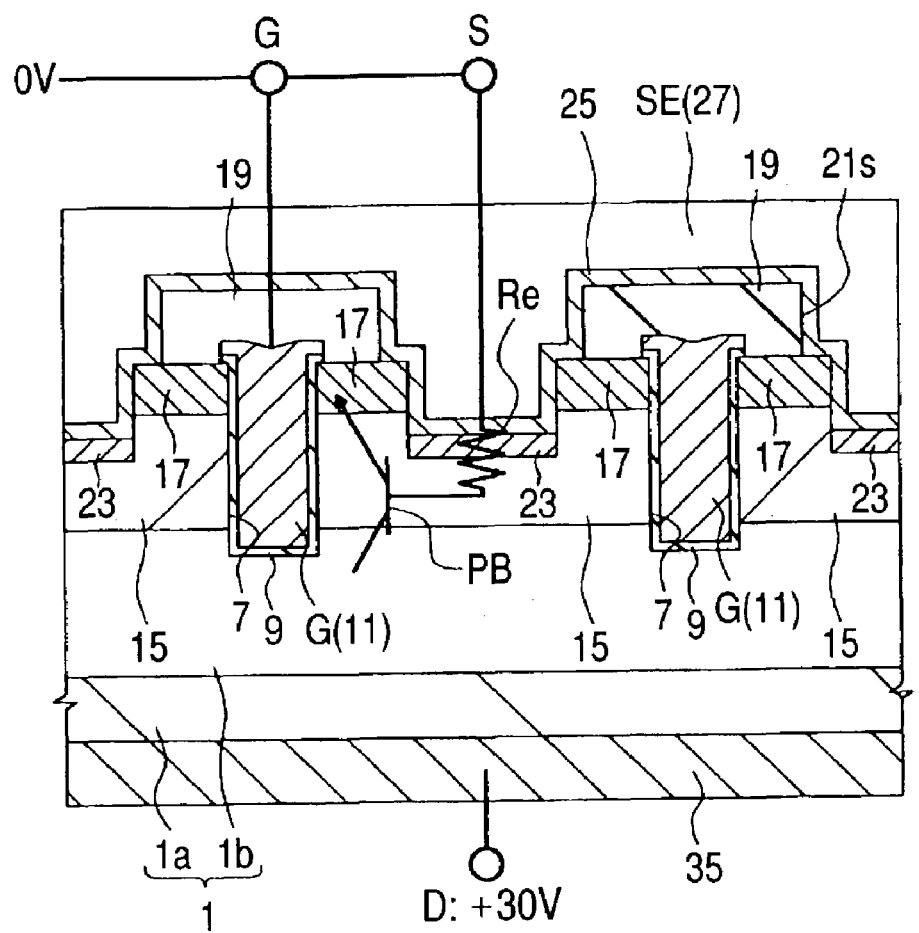
FIG. 20 is a cross sectional view for a main portion of a substrate showing a relation between an n-channel type power MISFET and an npn type parasitic bipolar transistor.

In an n-channel type power MISFET, as shown in FIG. 20, an npn-type parasitic bipolar transistor PB constituted with an $n^+$-semiconductor region (source region) 17, a $p^-$-semiconductor region (channel region) and a drain (1a, 1b) is present inside. G, S and D mean gate, source and drain, respectively.

BVDSS of the n-channel type power MISFET (breakdown voltage for drain—channel junction when voltage is applied to the drain in a state where voltage between gate and source is 0 V) is equivalent with $BV_{CES}$ of the bipolar transistor (breakdown voltage for collector—base junction when voltage is applied to the collector in a state where voltage between base and emitter is 0 V), and is substantially equivalent with $BV_{CBO}$ (junction withstand voltage for $p^-$-semiconductor region 15 and the drain 1b) in a structure where the MISFET does not punch through.

The bases of the parasitic bipolar transistor PB ($p^-$-semiconductor region 15 and $p^+$-semiconductor region 23) are connected electrically with the Al film 27 by way of the barrier film 25. That is, since the emitter ($n^+$-semiconductor region 17) and the base ($p^-$-semiconductor region 15) are short circuited by the source electrode SE in this structure, it is ideal that the regions are theoretically at an identical potential.

Figure 21:
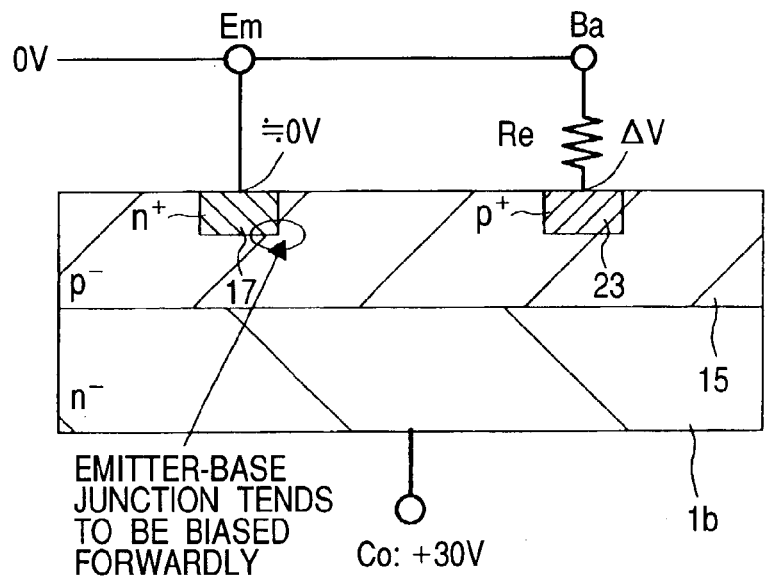
FIG. 21 is a schematic cross sectional view for a main portion of a substrate showing a relation between a parasitic bipolar transistor and resistance Re, etc.

However, in a case of using a metal such as TiW having a higher contact resistance to p-Si, that is, a metal having lower ΦB to n-Si such as TiW as the barrier film, a high resistance Re is added to the bases ($p^-$-semiconductor region 15 and $p^+$-semiconductor region 23) as shown in FIG. 21.

As a result, the emitter Em and the base Ba are more tended to be biased forwardly. That is, the parasitic bipolar transistor tends to take an on-state to increase the leak current (IDSS).

Figure 22:
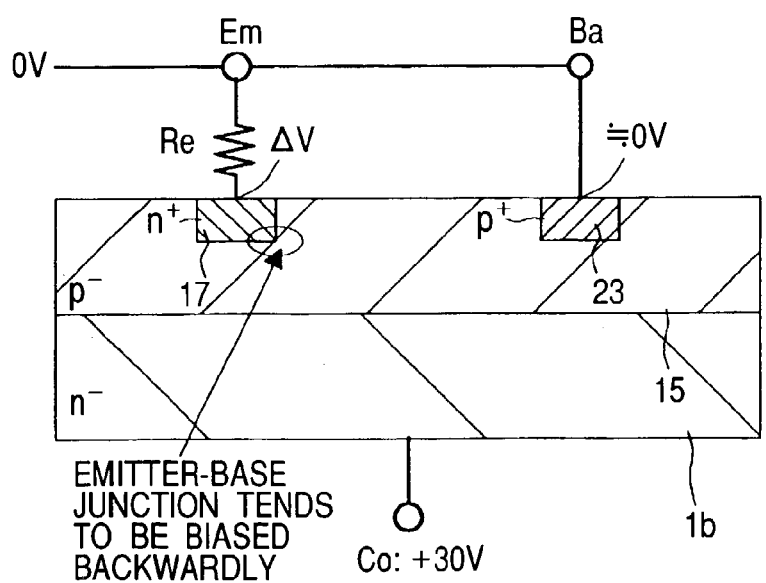
FIG. 22 is a schematic cross sectional view for a main portion of a substrate showing a relation between a parasitic bipolar transistor and resistance Re, etc.

On the other hand, in a case of using, as the barrier film, a metal such as $MoSO_2$ having a higher contact resistance to n-Si, that is, a metal having higher ΦB to n-Si, a higher resistance Re is added to the emitter ($n^+$-semiconductor region 17) as shown in FIG. 22.

As a result, the emitter Em and the base Ba are more tended to be biased backwardly. That is, the parasitic bipolar transistor tends to take an off-state to decreases the leak current (IDSS).

Figure 23:
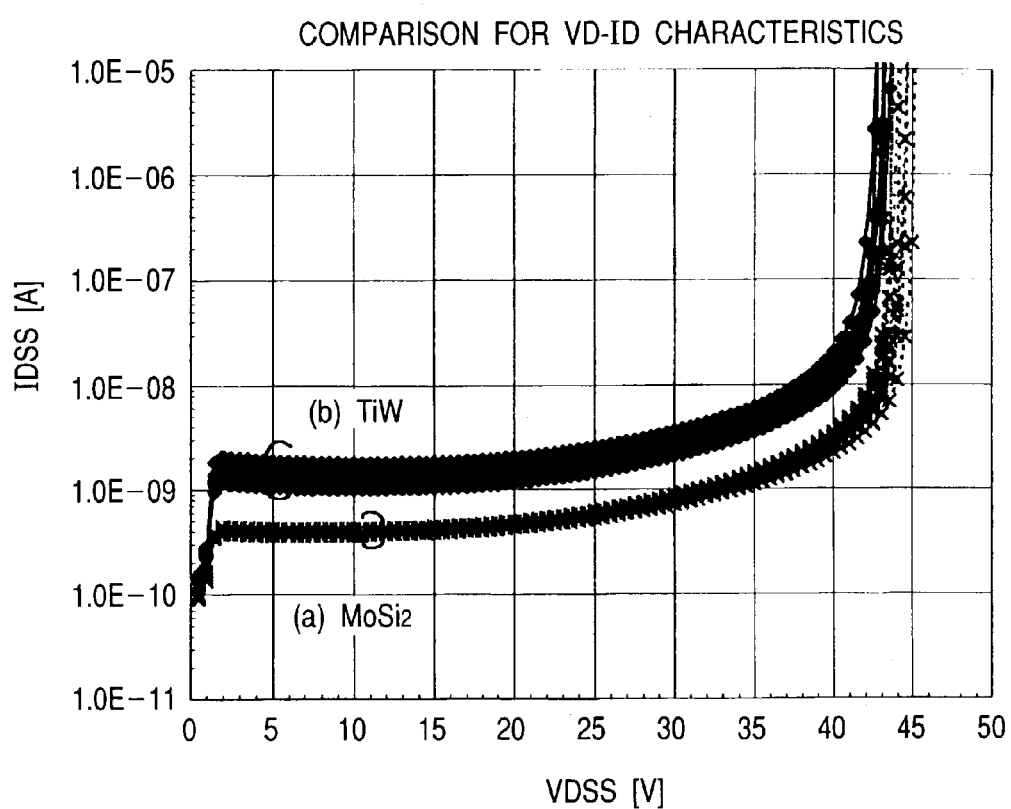
FIG. 23 is a graph showing a relation between IDSS [A] and VDSS [V] in a case of using TiW and in a case of using $MoSi_2$ as the material for a barrier film.

FIG. 23 shows a result of examining a relation between IDSS[A] and VDSS[V] by using TiW and $MoSi_2$ as the material for the barrier film each of an identical chip size and each by the number of ten samples. As shown in the graph, in a case of using $MoSi_2$ as the barrier film (graph (a)) IDSS can be lowered than in a case of using TiW for the barrier film (graph (b)). For example, in a case of using TiW for the barrier film at VDSS of 30.5 V and VGS (gate potential) of 0 V, IDSS was 2.15 nA to 3.74 nA, whereas in a case of using $MoSi_2$ for the barrier film, IDSS was from 742 pA to 918 pA. As described above, in a case of using $MoSi_2$ leak current (IDSS) could be decreased to about ⅓ of that in a case of using TiW.

As described above, according to this embodiment, since a metal of higher barrier height ΦB than TiW to n-Si is used for the barrier film of the n-channel type power MISFET, the leak current (IDSS) can be decreased.

Further, since the metal having lower contact resistance to p-Si (23 or 15) than the contact resistance to n-Si (17) is used, the leak current (IDSS) can be decreased.

Figure 24:
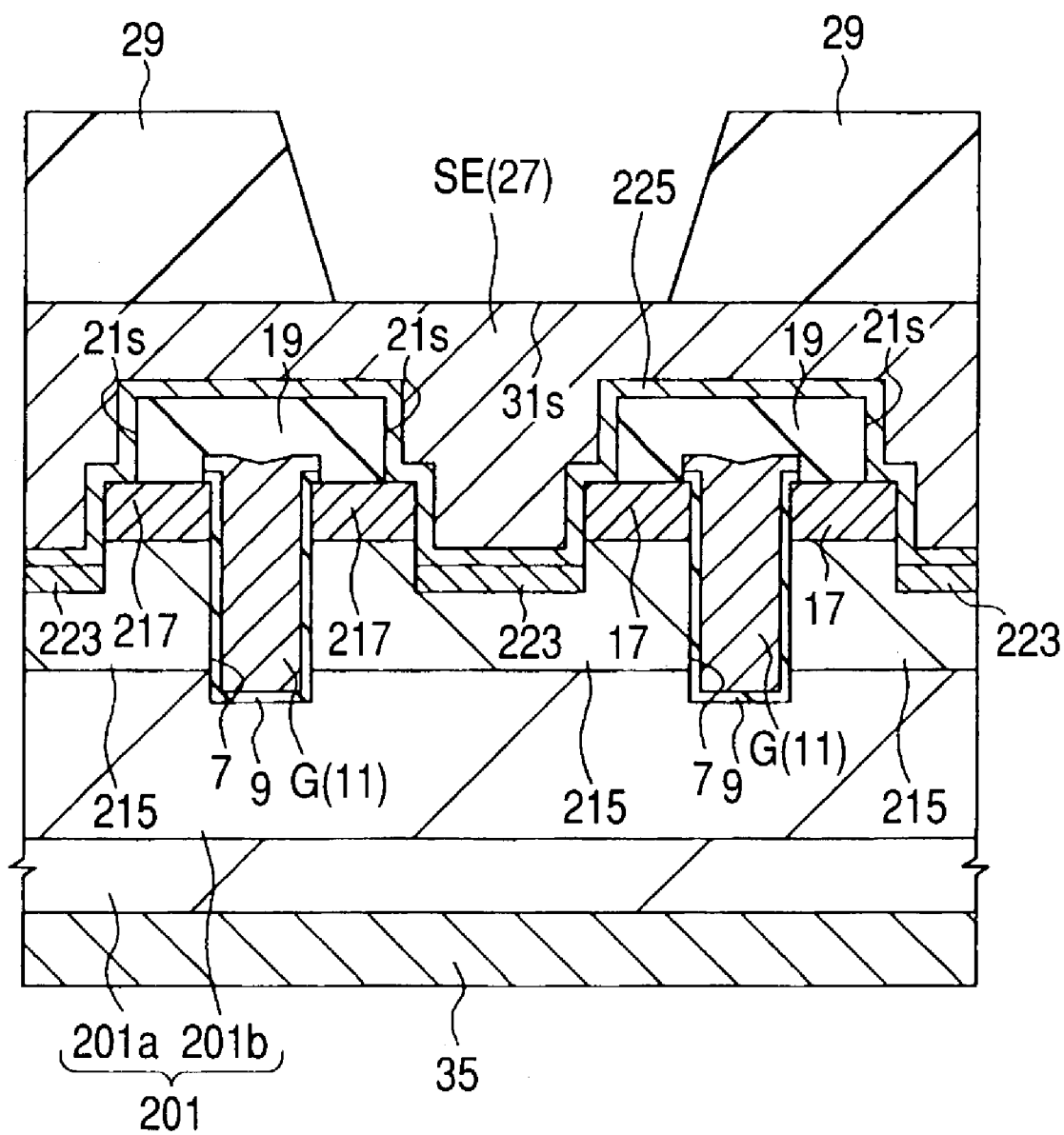
FIG. 24 is a cross sectional view for a main portion of a substrate showing a semiconductor device according to Embodiment 1 of the invention.

While description has been made to an example of the n-channel type power MISFET, the leak current can be decreased also in a p-channel type power MISFET by properly selecting the material for the barrier film. FIG. 24 shows a cross sectional view for a main portion of a p-channel type power MISFET. In this case, while the conduction type of the impurity for each of the portions constituting the p-channel type power MISFET is different, it can be formed by the identical process for the n-channel type power MISFET. 201 denotes a substrate comprising a p-single crystal silicon substrate 201a and a p-single crystal silicon layer 201b. Further, there are also shown an n⁻-semiconductor region (channel region, well) 215, a p⁺-semiconductor region (source region) 217, and an n⁺-semiconductor region (back gate contact region) 223.

That is, in a case of using a metal having lower contact resistance to n-Si, that is, having lower ΦB to n-Si for the barrier film 225, a high resistance Re is added to the emitter. As a result, the emitter and the base are more tended to be biased backwardly. That is, the parasitic bipolar transistor tends to take an off-state to decrease the leak current (IDSS).

As described above, in the p-channel type power MISFET, the leak current (IDSS) can be decreased by using a metal of lower barrier height ΦB to n-Si (for example, 0.65 or less in a case of TiW) as the barrier film.

Further, the leak current IDSS can be decreased by using a metal of higher contact resistance to p-Si (217) than the contact resistance to n-Si (223 or 215).

(2) Then, the effect of improving the avalanche resistance amount is to be described below.

Figure 25:
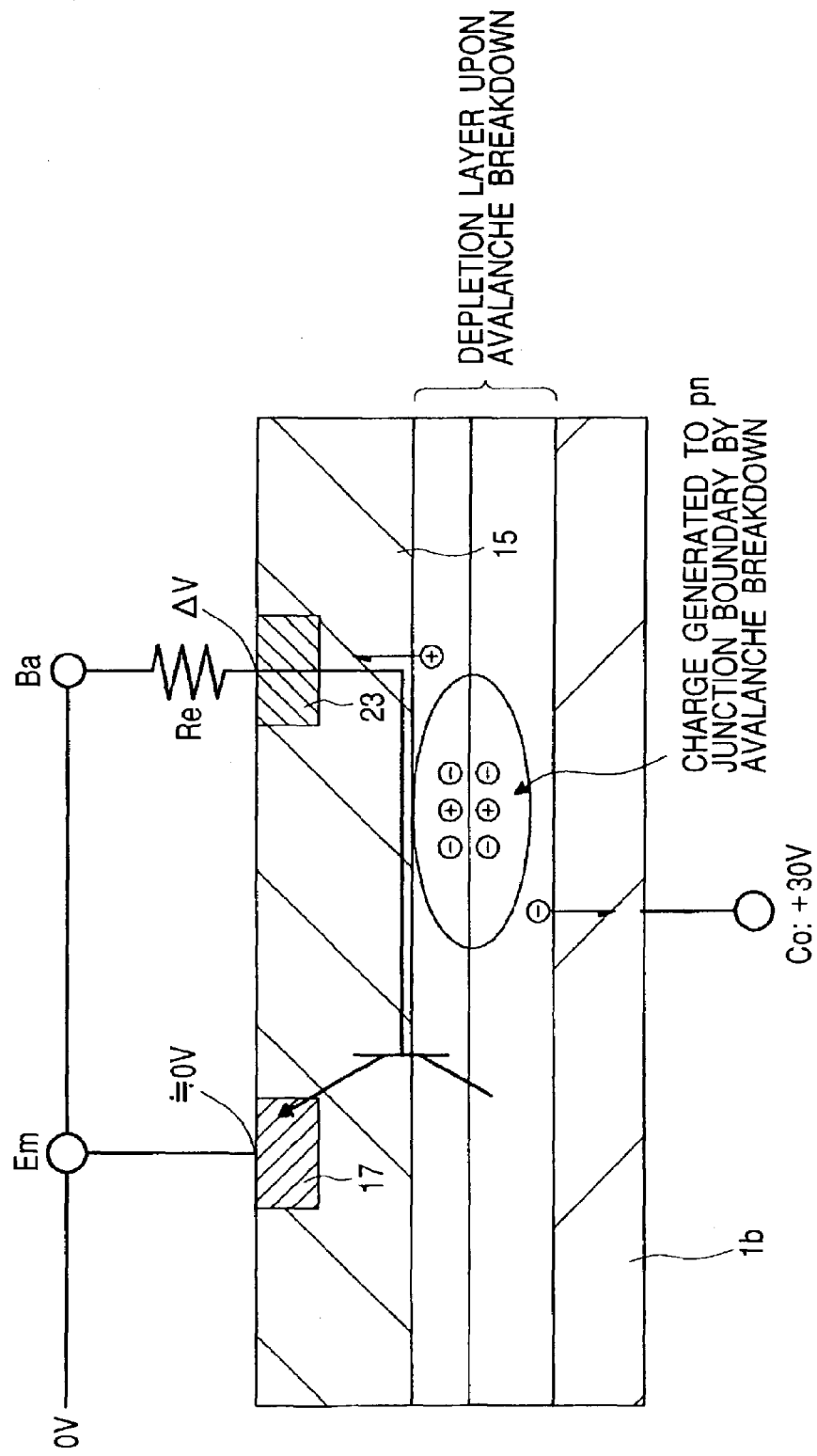
FIG. 25 is an equivalent circuit diagram in a avalanche state of an n-channel type power MISFET.
Figure 26:
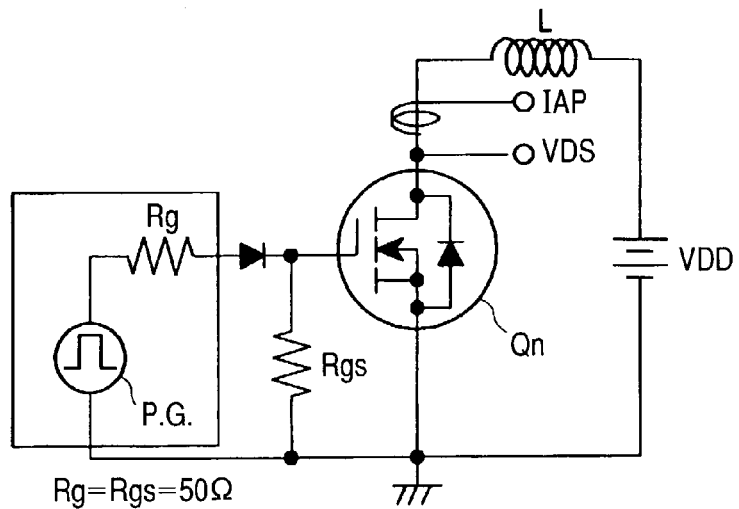
FIG. 26 is a circuit diagram showing an avalanche resistance amount measuring circuit of an n-channel type power MISFET.
Figure 27:
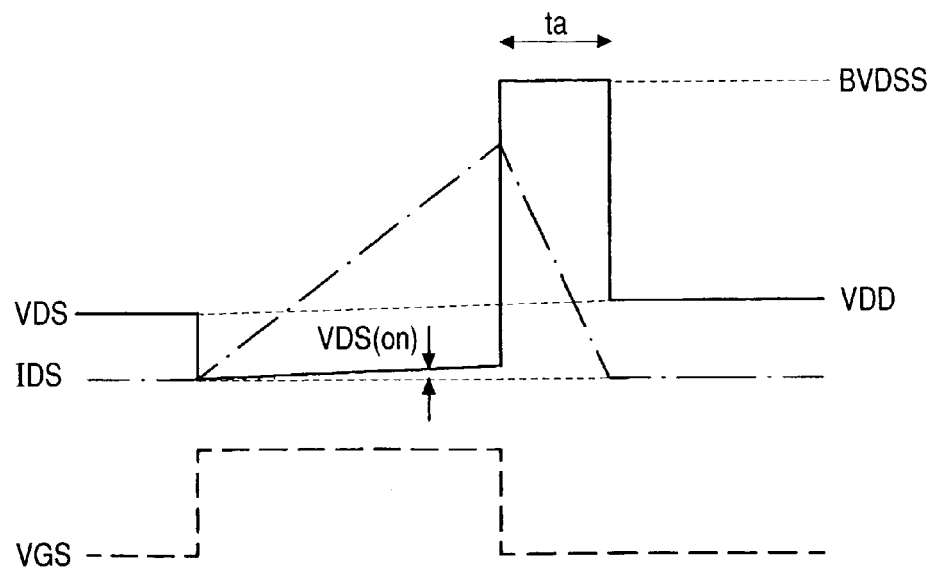
FIG. 27 is a waveform chart showing a relation for VDS, IDS and VGS of an n-channel type power MISFET.

FIG. 25 shows an equivalent diagram for the avalanche state, FIG. 26 shows a circuit for measuring avalanche resistance amount and FIG. 27 shows waveforms for VDS (drain—source voltage:solid line), IDS (drain—source current:dotted chain), and VGS (gate—source voltage:broken line).

FIG. 26 shows an example of a circuit for measuring avalanche resistance amount in which a dielectric load L such as a transformer (hereinafter referred to as L load) is connected to the drain of a power MISFET Qn grounded at the source, and the L load is connected with a power source VDD grounded on one side. As shown in FIG. 27, when a power source voltage VDD is applied to a power MISFET and when the power MISFET is turned on (gate ON), VDS takes an extremely low value (on voltage VDS (on) value) and IDS increases gradually. Then, when the power MISFET is turned off (gate OFF), a counter electromotive force is generated to the L load in which VDS increases abruptly by the counter electromotive force to reach the breakdown voltage of drain—channel junction (VDSS) and then keeps BVDSS for a period till the energy accumulated in the L load is consumed (avalanche period ta). In this case, as shown in FIG. 25, a great amount of carriers (electrons and holes) are generated at the boundary of the pn junction (junction between p⁻-semiconductor region 15 and the substrate 1b), to cause an avalanche current to flow in which electrons pass toward the substrate (1a, 1b, collector Co, drain) while holes pass toward the p⁻-semiconductor region 15 (base Ba, channel). That is, the energy accumulated the L load is consumed by the breakdown of the pn junction in the power MISFET for the avalanche period ta. Accordingly, in the avalanche period ta, IDS decreases gradually and VDS decrease to the power source voltage VDD at the instance IDS decreases to zero. In this case, the energy that can be consumed by the semiconductor region in the power MISFET is referred to as an avalanche resistance amount. As has been described in (1) above with reference to FIG. 20 and FIG. 21, when the contact resistance is high to p-Si, the base resistance (diffusion resistance of the p⁻-semiconductor region 15 with respect to the Al film 27) is increased to cause voltage drop. As a result, the parasitic bipolar transistor described specifically (1) in above is operated. As has been described previously, a number of MISFET cells are connected in series in the power MISFET, in which a cell tending to turn-ON depending on the variation of characteristics of each of parasitic npn transistors is present. That is, current is concentrated to the cell of higher base resistance to destroy the power MISFET. This is referred to as avalanche breakdown.

Accordingly, for improving the avalanche resistance amount, it is necessary to make the parasitic bipolar transistor less tending to turn-ON.

Then, for reducing the base resistance, a metal is used which has higher barrier height ΦB than TiW with respect to n-Si (for example, $MoSi_2$) for the barrier film of the n-channel type power MISFET, so that the avalanche resistance amount can be improved.

Further, the avalanche resistance can be improved by using a metal having a lower contact resistance to p-Si than contact resistance to n-Si.

On the other hand, in the p-channel type power MISFET, the avalanche resistance amount can be improved by using a metal having a lower barrier height to n-Si as the barrier film (for example, barrier height ΦB of 0.65 or less).

Further, the avalanche resistance amount can be improved by using a metal having a higher contact resistance to p-Si than contact resistance to n-Si.

An example of a method of measuring the avalanche resistance amount includes a method of measuring an avalanche breakdown current. The avalanche breakdown current is an IDS value just before the breakdown of a device in a case where the on period for the power MISFET is gradually extended by a pulse generator P. G. and the energy to the power MISFET is kept to be increased gradually till the device is broken down while keeping the L load constant in FIG. 26. Rg and Rgs represent resistance each of which is about 50 Ω. Further, VDS and IAP represent measuring terminals.

Figure 28:
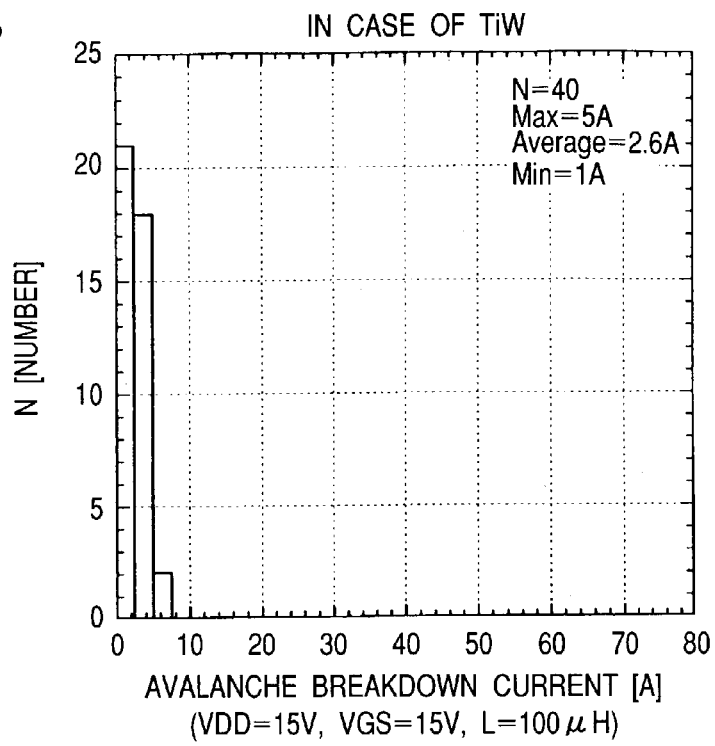
FIG. 28 is a graph showing a relation between IAP [A] and the N [number] in a case where the material for the barrier film is TiW.
Figure 29:
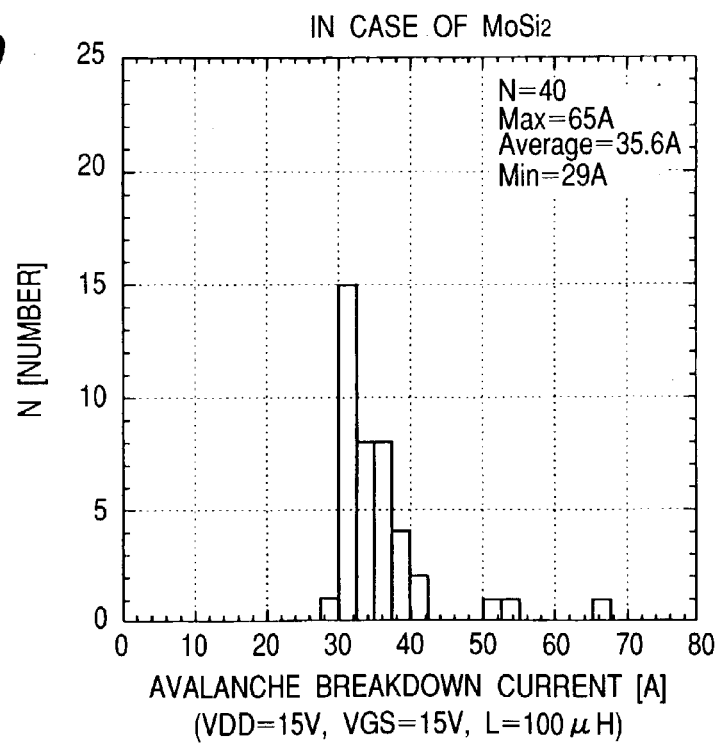
FIG. 29 is a graph showing a relation between IAP [A] and the N [number] in a case where the material for the barrier film is $MoSi_2$.

FIG. 28 is a graph showing a relation between the avalanche breakdown current [A] and the number N [number] in a case of using TiW as the material for the barrier film of the n-channel type power MISFET. FIG. 29 is a graph in a case of using $MoSi_2$ as the material for the barrier film. VDD is 15 V, VGS is 15 V, L is 100 µH and N is 40.

AS shown in FIG. 28 and FIG. 29. In a case of using $MoSi_2$ for the barrier material, the avalanche resistance amount (avalanche break down current) can be improved. In a case of FIG. 28, the maximum value (Max) is 5 A, the minimum value (Min) is 1 A and the average value thereof is 2.6 A for the avalanche breakdown current. On the contrary, in a case of FIG. 29, the maximum value is 65 A, the minimum value is 29 A and the average value is 35.6 A for the avalanche breakdown current.

The power MISFET is used as a high speed switching device, for example, to a switching power source circuit or a DC/DC converter. In the power MISFET described above, as the operation frequency goes higher, a surge voltage (over voltage exceeding drain withstanding voltage) of a narrow pulse width tends to be generated upon turn-OFF by the inductance in the circuit and stray inductance for wirings.

For absorbing the surge voltage, it is suitable to use this embodiment since high avalanche resistance amount is necessary for the power MISFET.

(3) As has been described above specifically, in the n-channel type power MISFET, the leak current can be decreased and the avalanche resistance amount can be improved by using $MoSi_2$ as the barrier film compared with the case of using TiW.

However, use of $MoSi_2$ may possible cause a worry of electro-migration resistance and may possibly cause a problem of deterioration in the coverage. The problems described above are overcome in this embodiment by the countermeasures to be described below.

Generally, it is considered that TiW has electro-migration (EM) resistance and can improve the wiring life. However, in the power MISFET, the pattern for the gate electrode GE and the source electrode SE is large and the current density is not high as has been described with reference to FIG. 10. Also in the contact portion, since cells of several tens of thousands are connected in parallel, current flowing per unit contact is not large compared with usual integrated circuits.

Accordingly, also in a case of using $MoSi_2$, EM resistance can be maintained.

Further, the thickness can be increased in the TiW film and it can be formed, for example, to about 150–200 nm. On the contrary, in a case of using $MoSi_2$, increase in the film thickness is difficult since it is considered that Si constituting $MoSi_2$ invades into the Al film to increase the resistance of Al wirings. Accordingly, the barrier property is deteriorated to possibly lower the coverage for the contact trench 21s.

In view of the above, in this embodiment, the diameter for the contact trench 21s is made to about 1.0 μm and the film thickness of $MoSi_2$ was made to 60 nm.

According to the study of the present inventors, even when the thickness of the $MoSi_2$ film was about 60 nm, there was found no increase in the resistance in the Al wirings that would give rise to the problem in view of operation.

As described above, the barrier property and the coverage of $MoSi_2$ can be improved by increasing the thickness of the $MoSi_2$ film to some extent and decreasing the aspect ratio of the contact trench.

Naturally, even when the aspect ratio is large, coverage can be improved, for example, by the improvement for the film deposition method or improvement for the performance of the film deposition apparatus.

(Embodiment 2)

Description has been made for Embodiment 1 to an example of using $MoSi_2$ as a metal having higher barrier height ΦB than TiW to n-Si used for the barrier film of the n-channel type power MISFET. In this embodiment, barrier height ΦB between various kinds of metals and n-Si are examined, and description is to be made for barrier films which are used suitably to the n-channel type power MISFET or p-channel type power MISFET.

FIG. 30 is a table showing the barrier height ΦB [V] of various kinds of metals to n-Si, which is a table for metals having higher barrier height ΦB than that in the case of using TiW as the barrier film (barrier metal film).

In a case of using metals described in the table, i.e., Co (cobalt), Ni (nickel), Rh (rhodium), $MoAl_x$, Pb (lead), Mn (manganese), Pt (platinum) or Ir (iridium) as the barrier film, the barrier height ΦB to n-Si is high and the leak current can be decreased and the avalanche resistance amount can be improved, for example, by using the barrier film 25 shown in FIG. 11. The metals are not necessarily elemental metals but an impurity may be contained in the film or metals may be chemically bonded with other elements so long as the metals described above are main constituent metal in the film. Further, in a case where the metals can react with elements constituting the substrate or the upper electrode (source electrode), a consideration is taken for the barrier height ΦB between the reaction product and the substrate.

Among them, since Co and Ni are metals often used in the field of semiconductors and various studies have been made for the characteristics thereof, they are suitable to be used as the barrier film. Further, various film deposition methods have also been studied and, for example, they can be easily deposited into films by using a sputtering apparatus. Further, they are inexpensive and can reduce the manufacturing cost of the apparatus. For Co and Ni, there is a certain range for the numerical values of the barrier height ΦB. This is because the numerical values vary depending on the conditions for forming the metals and silicide layers. Accordingly, it is necessary to control the forming conditions such that the barrier height ΦB becomes higher (for example, so as to be 0.65 or higher).

Further, since Pt is also used often in the field of semiconductors and various studies have also been made for the characteristics and the film deposition method therefor, so that it is suitably used for the barrier film. It has an outstandingly high barrier height ΦB and is used suitably for the barrier film.

Further, Pb has a lower melting point and can not be used for apparatus requiring high temperature heat treatment step after formation of the barrier film. Further, in the use of Mn or Rh, their characteristics or film deposition methods have to be taken into consideration. Further, while Ir has high barrier height ΦB value and is prospective, characteristics and film deposition methods therefor have to be taken into consideration.

FIG. 31 is a table showing the barrier height ΦB of various kind of metals to n-Si, which is a table for metals having lower barrier height ΦB than that in the case of using TiW for the barrier film.

In a case of using metals described in the table, that is, Co (cobalt), Ti (titanium), Ta (tantalum), Cr (chromium), Mo (molybdenum), Zr (zirconium), and Hf (hafnium) as the barrier film, the barrier height ΦB to n-Si is low and the leak current can be decreased and the avalanche resistance amount can be improved when used for the barrier film 225 of the p-channel type power MISFET shown in FIG. 24.

The metals are not necessarily elemental metals but an impurity may be contained in the film or metals may be chemically bonded with other elements so long as the metals described above are main constituent metal in the film. Further, in a case where the metals can react with elements constituting the substrate or the upper electrode (source electrode), a consideration is taken for the barrier height ΦB between the reaction product and the substrate.

Among them, Since Ti is a metal often used in the field of semiconductors and various studies have been made for the characteristics thereof, it is used suitably as the barrier film. Further, various film deposition methods have also been studied and films can be deposited easily, for example, by using a sputtering apparatus. Further, it is inexpensive to reduce the production cost of the apparatus. In addition to Ti, TiN (titanium nitride) may also be used.

Further, various studies have also been made for the characteristics and the film deposition methods of Co, which is inexpensive as well, Co is suitably used for the barrier film. As has been described above, there is a certain range for the numerical value of barrier height ΦB for Co. Accordingly, it is necessary to control the forming conditions such that the barrier ΦB is lower (for example, so as to be 0.65 or less).

Further, since Cr and Mo are also used often in the field of semiconductors and various studies have been made for the characteristics and the film deposition methods, they are suitably used for the barrier film. Further, they have relatively lower barrier height ΦB and used suitably for the barrier film. However, in a case of using Mo for the barrier film and an Al film for the upper electrode, since $MoAl_x$ is formed to improve the barrier height ΦB, it is necessary to take a consideration, for example, use of a metal film other than Al film or formation of a reaction preventive film relative to the Al film. Further, since Ta is also used often in the field of semiconductors and various studies have been made for the characteristics and the film deposition method, it is suitably used for the barrier film. TaN (tantalum nitride) may also be used. Further, Zr and Hf have lower barrier height ΦB values and are prospective but consideration have to be taken on the characteristics and film deposition method.

In this embodiment, description has been made to an example of the barrier height ΦB of various kinds of metals to n-Si, but relation between ΦBn to n-semiconductor and ΦBp to p-semiconductor can be represented by the equation:

$$\Phi Bp = Eg/q - \Phi Bn$$

in which Eg represents a band gap and q represents a charge amount of electrons.

For example, since Si band gap is 1.12 eV, ΦBp to p-Si can be expressed by the equation:

$$\Phi Bp = 1.12 - \Phi Bn$$

Accordingly, in a case, for example, of Ti, since ΦB to n-Si is 0.60 V, ΦB relative to p-Si is 0.52 V. Further, for example, in a case of Cr, since ΦB relative to n-Si is 0.57 V, ΦB relative to p-Si is 0.55 V.

As described above, the sequence for the magnitude of the barrier height ΦB of metals relative to n-Si is reversed with respect to the case of p-Si.

(Embodiment 3)

Figure 32:
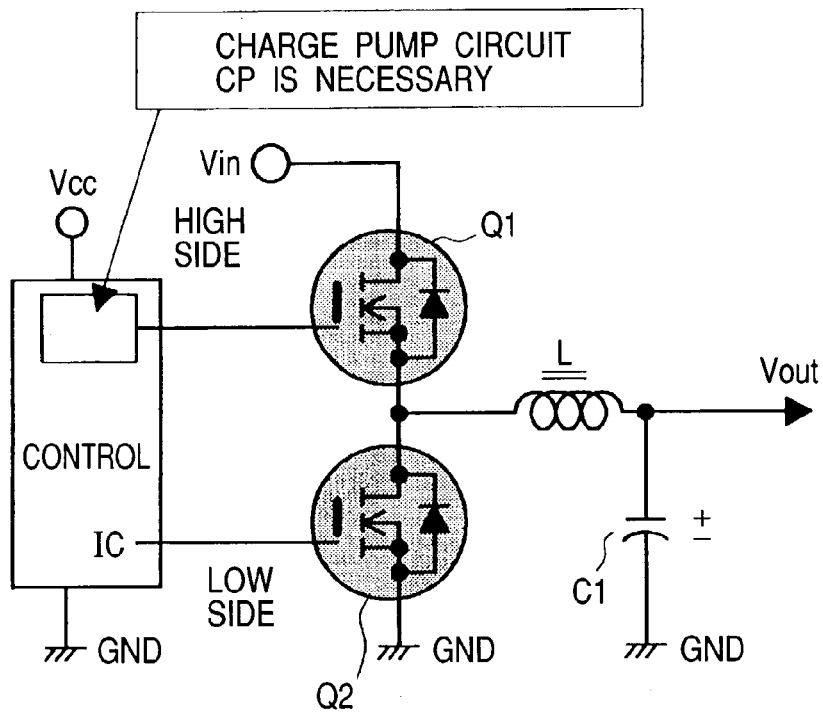
FIG. 32 is a circuit diagram showing a DC/DC converter using an n-channel type power MISFET.

For example, as shown in FIG. 32, the DC/DC converter includes a structure in which an n-channel type power MISFET Q1 and Q2 are connected in series between an input potential Vin and the ground potential GND. L represents an inductance which is located between the connection node of Q1 and Q2 and the output potential Vout. Further, a capacitance C1 is connected between the ground potential GND and the power potential Vout. Further, a built-in diode is connected between the source and the drain of the n-channel type power MISFET Q1 and Q2.

The side of the input potential Vin is referred to as a high side while the side of the ground potential GND is referred to as a low side.

The n-channel type power MISFET Q1 and Q2 are driven by a controller IC connected between the power source potential Vcc and the ground potential GND.

For example, the n-channel type power MISFET Q1 on the high side is driven by a charge pump circuit CP that outputs a voltage higher than the source potential. The charge pump circuit CP is generally build-in the controller IC.

However, there is a DC/DC converter using the p-channel type power MISFET on the high side in order to save the charge pump circuit CP.

Figure 33:
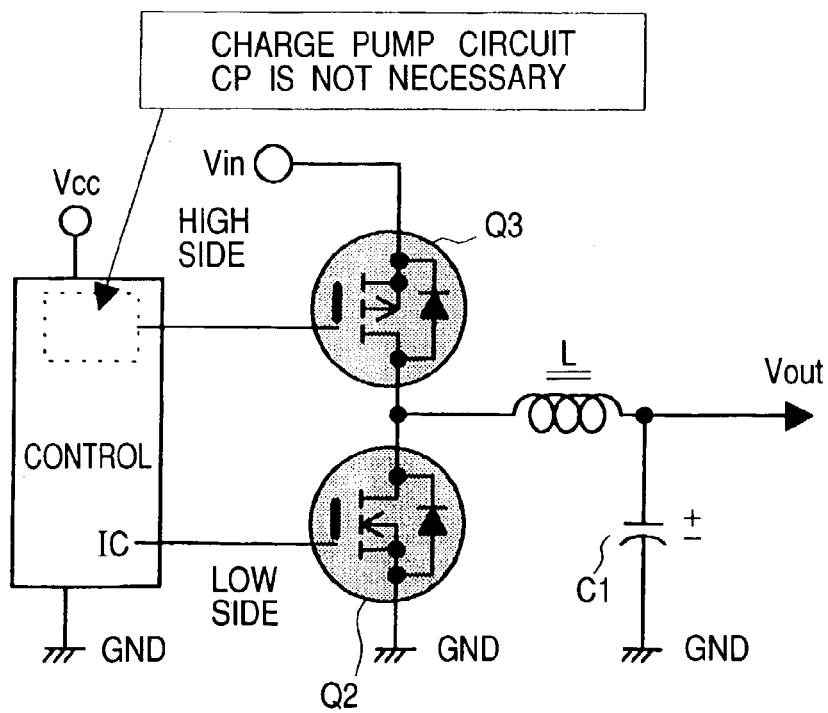
FIG. 33 is a circuit diagram showing a DC/DC converter using an n-channel type power MISFET, and a p-channel type power MISFET.

FIG. 33 shows a circuit diagram for a DC/DC converter using the p-channel type power MISFET Q3 on the high side. Constitutions other than the p-channel type power MISFET Q3 and the charge pump circuit CP are identical with those in FIG. 32.

The barrier film of the p-channel type power MISFET Q3 and the n-channel type power MISFET Q2 in the circuit described above can be optimized by considering the barrier height ΦB.

For example, by using a metal having a relatively higher barrier height ΦB for the barrier film of the n-channel type power MISFET Q2 (for example, $MoSi_2$) and using a metal having relatively lower barrier height ΦB to the n-Si for the barrier film of the p-channel type power MISFET Q3 (for example, TiN), the leak current of the power MISFET (Q3, Q2) can be decreased, and the avalanche resistance amount can be improved to improve the characteristics of the DC/DC converter.

Figure 34:
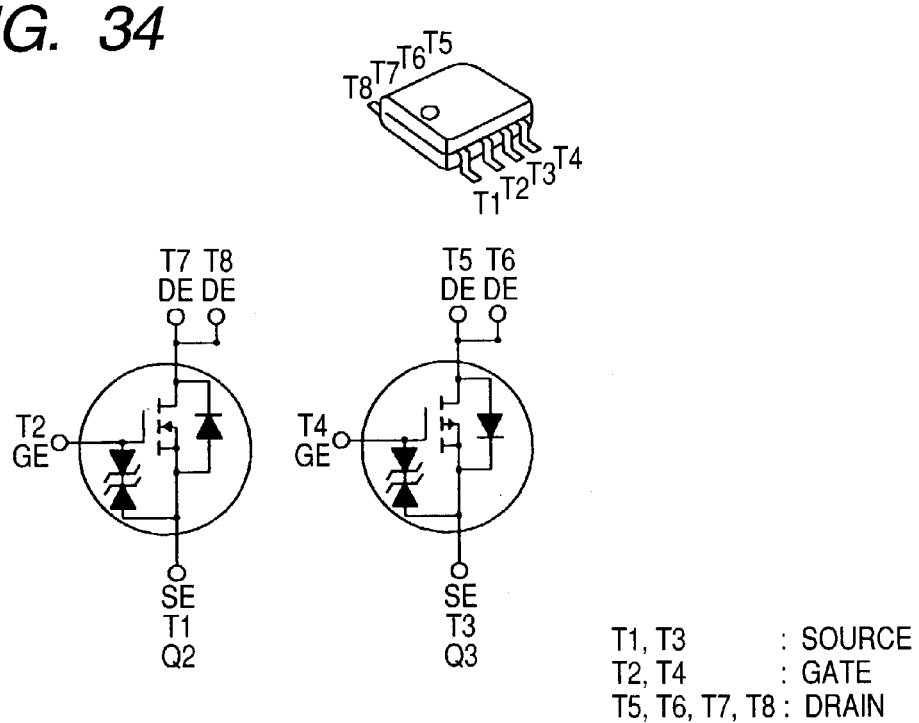
FIG. 34 is a perspective view and an internal circuit diagram of a package in a case of forming an n-channel type power MISFET and a p-channel type power MISFET into one package.

Further, as shown in FIG. 34, the power MISFET (Q3, Q2) may be formed into one package. The upper portion of the drawing is a perspective view for a package in which the n-channel type power MISFET and the p-channel type power MISFET are formed into one package and a lower portion thereof is an internal circuit diagram.

Figure 35:
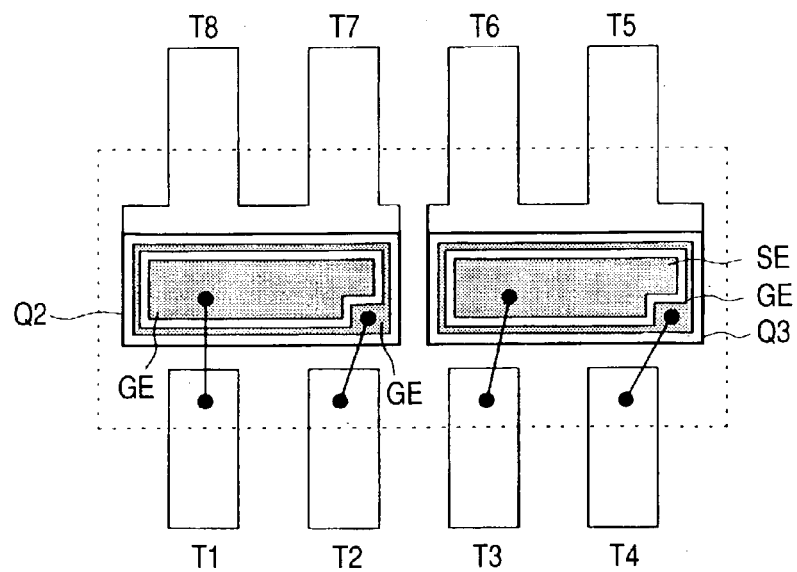
FIG. 35 is a plan view for a main portion of a device in a case of forming an n-channel type power MISFET and a p-channel type power MISFET into one package.

In the drawings, T1–T8 represent external terminals in which T1 is connected with the source electrode SE of Q2, T2 is connected with the gate electrode GE of Q2, and T7 and T8 are connected with the drain electrode DE of Q2. Further, T3 is connected with the source electrode SE of Q3, T4 is connected with the gate electrode GE of Q3, T5 and T6 are connected with the drain electrode DE of Q3. FIG. 35 shows an example of a plan view for a main portion of the apparatus shown in FIG. 34. The drain electrodes DE is formed on the rear face of each of chips and connected by way of a die pad to an external terminal (T8 and T7, and T6 and T5).

That is, for example, the n-channel type power MISFET Q2 is constituted as shown in FIG. 11, while the p-channel type power MISFET Q3 is constituted as shown in FIG. 24, and they are die bonded on die pads of a lead frame, connected by using external terminals and gold wires and then the periphery of the chip is resin-sealed.

As described above, in the device incorporating the n-channel type power MISFET and the p-channel type power MISFET, characteristics of the device can be improved by using different films for the respective barrier films, while using a metal having a relatively higher barrier height ΦB to n-Si (for example, $MoSi_2$) in the case of the n-channel type and using a metal having a relatively lower barrier height ΦB to the n-Si (for example, TiN) in the case of the p-channel type.

(Embodiment 4)

In Embodiment 1, coverage of MoSi$_2$ is improved by ensuring a large diameter for the contact trench 21s and decreasing the aspect ratio, but the coverage can be improved by taking a consideration for the shape of the contact trench as shown below.

Figure 36:
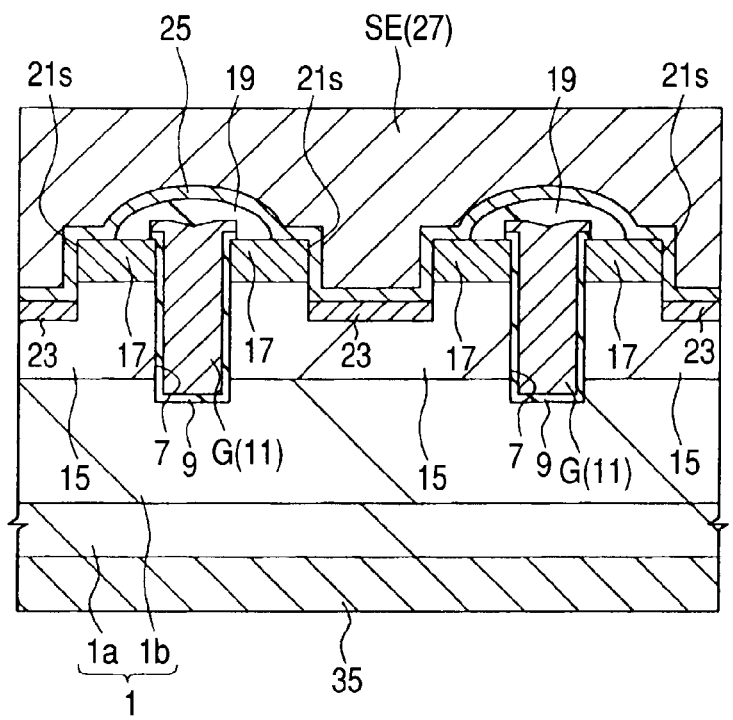
FIG. 36 is a cross sectional view for a main portion of a substrate showing a method of manufacturing a semiconductor device according to Embodiment 4 of the invention.

In FIG. 36, the width and the height of the silicon oxide film 19 remaining on the gate portion G are decreased with the upper portion thereof being rounded.

For example, after forming the silicon oxide film 19 as shown in FIG. 6, a silicon oxide film 19 and the substrate 1 (p$^-$-semiconductor region 15 and n$^+$-semiconductor region 17) are etched to form contact trenches (source contact) 21s and then over etching is conducted under the condition where the selectivity of the silicon oxide film 19 to the substrate 1 is high (silicon oxide film 19 is etched more easily).

As a result, the aspect ratio of the contact groove 21s is decreased and the step above the gate portion G is moderated to improve the coverage of the barrier film 25, for example, of MoSi$_2$.

Figure 37:
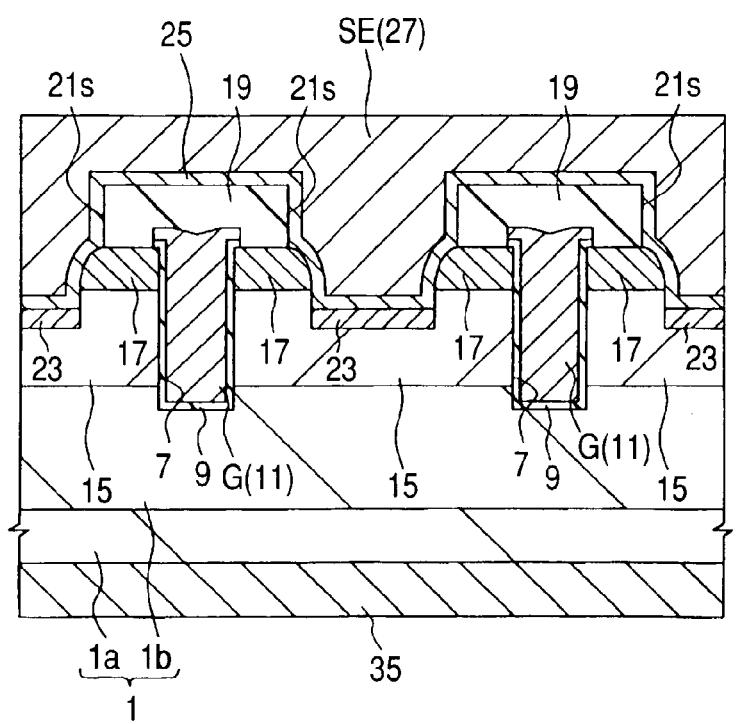
FIG. 37 is a cross sectional view for a main portion of a substrate showing a method of manufacturing a semiconductor device according to Embodiment 4 of the invention.

Further, in FIG. 37, side walls of the contact trenches 21 in the substrate 1 are rounded.

For example, after forming a silicon oxide film 19 as shown in FIG. 6, an opening is formed in the silicon oxide film 19 and, further, the substrate is dry etched while forming a great amount of polymer on the lateral surface.

Figure 38:
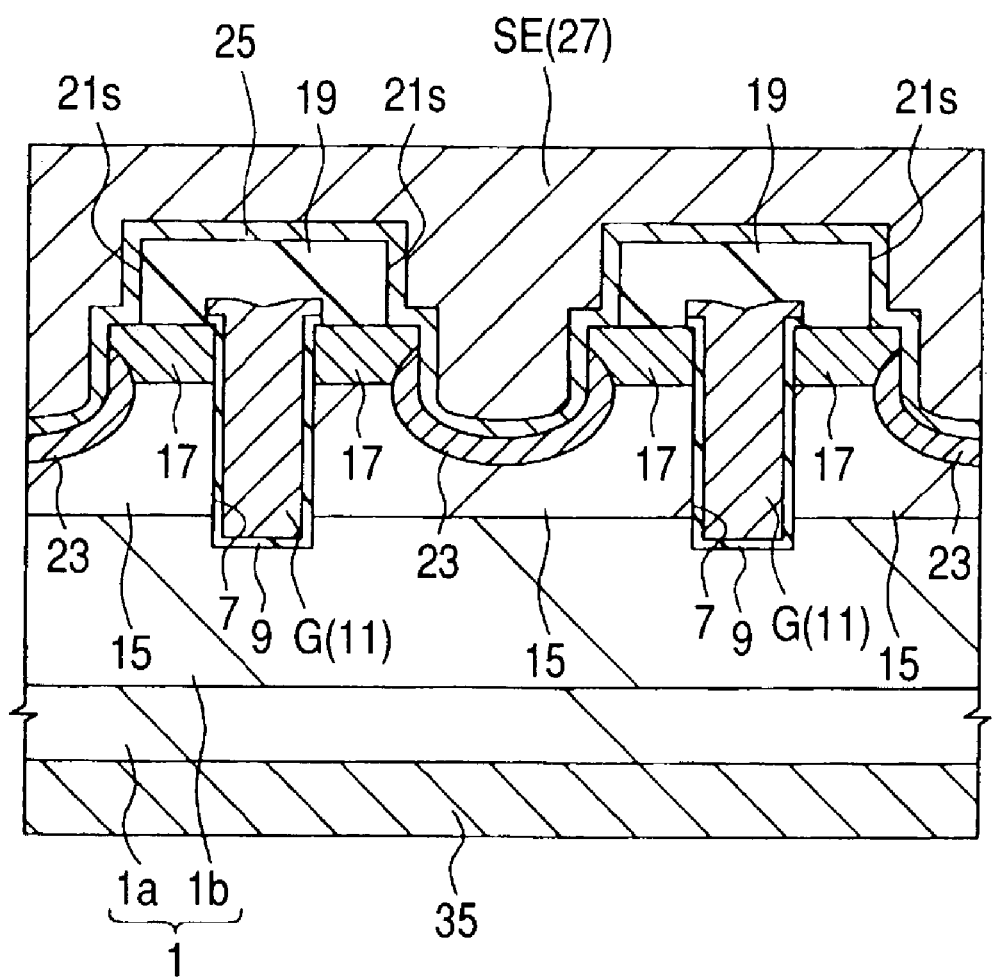
FIG. 38 is a cross sectional view for a main portion of a substrate showing a method of manufacturing a semiconductor device according to Embodiment 4 of the invention.

Further, in FIG. 38, the bottom of the contact trench 21s is rounded.

For example, after forming a silicon oxide film 19 as shown in FIG. 6, the silicon oxide film 19 and the substrate 1 (p$^-$-semiconductor region 15 and n$^+$-semiconductor region 17) are etched to form a contact trench (source—contact) 21s and, further, the bottom of the contact hole 21s is isotropically etched to round the bottom thereof.

As a result, coverage of the barrier film 25, for example, of MoSi$_2$ can be improved.

In FIG. 36 to FIG. 38, since constitutions and manufacturing methods other than the contact trenches 21 or the barrier film 25 are identical with those of Embodiment 1 (for example, referred to FIG. 9) explanations therefor are to be omitted.

By the consideration on the shape of the contact trench as described above, coverage can be improved.

The inventions made by the present inventors have been described specifically with reference to the preferred embodiments but the invention is not restricted to the embodiments and it will be apparent that the invention can be changed variously within a range not departing the scope thereof.

For example, in Embodiment 1, while the pattern for the trenches 7 is defined to the shape shown in FIG. 2, various modifications are possible, for example, by making the octagonal pattern 22 into a tetragonal shape, or making the pattern for the trenches into a stripe-like shape.

Further, in Embodiment 1 described above, while the gate portion is made in a trench structure, a planar type may also be provided additionally.

For example, the gate portion G in FIG. 11 is formed by patterning a polycrystal silicon film formed on a semiconductor substrate by way of a gate insulation film. In this case, n$^+$-semiconductor region (source region) 17 is formed in the semiconductor substrate on both sides of the gate portion. The source region may not necessary be formed on both sides but on any one side of the gate portion. Since constitutions for other portions are identical with those in Embodiment 1 (for example referred to FIG. 1), explanations therefor will be omitted.

Further, it is applicable not only to the power MISFET but also to MISFET in which the channel region (well), and the source or the drain region are electrically connected.

That is, a gate electrode is formed by patterning a polycrystal silicon film formed by way of a gate insulation film to the main surface of a well formed in a semiconductor substrate and, further, source—drain regions are formed in the semiconductor substrate on both sides of gate electrode. For example, the embodiment described above may also be applied to a conductive portion connected electrically with the source or drain and well (for example, plugs or wiring portions). Further, also in this case, the gate portion of MISFET may be constituted into a trench structure.

The effects obtained by typical inventions among those disclosed in the present application are briefly describe as below.

Since the conductive portion in contact with the source portion and the channel portion of MISFET is constituted with the first conductor and a second conductor arranged between the first conductor and the semiconductor substrate (source portion and channel portion), in which the contact resistance between the source portion and the conductive portion is made higher than the contact resistance between the channel portion and the conductive portion, the leak current can be decreased and the avalanche resistance amount can be improved in the MISFET.

Further, the characteristics of the semiconductor device having MISFET can be improved.

What is claimed is:

1. A semiconductor device comprising:
   (a) a MISFET formed in a semiconductor substrate, including:
      (a1) a gate portion comprising a first conductor formed in a trench in the semiconductor substrate;
      (a2) a source portion comprising a semiconductor region of a first conduction type in contact with a side wall of the gate portion;
      (a3) a drain portion comprising a semiconductor region of the first conduction type formed to a rear face of the semiconductor substrate; and
      (a4) a semiconductor region of a conduction type opposite to the first conduction type arranged between the source portion and the drain portion, and
   (b) a conductive portion formed above the semiconductor substrate and in contact with the source portion and the semiconductor region of the second conduction type, including:
      (b1) a second conductor; and
      (b2) a third conductor arranged between the second conductor and the semiconductor substrate,
   (c) wherein the contact resistance between the source portion and the conductive portion is higher than the contact resistance between the semiconductor region of the second conduction type and the conductive portion.

2. A semiconductor device according to claim 1, wherein the conductive portion is formed in another trench in the semiconductor substrate.

3. A semiconductor device according to claim 1, wherein the first conduction type is n-type, the second conductor is a film mainly comprised of aluminum and the third conductor is comprised of molybdenum silicide.

4. A semiconductor device according to claim 1,
wherein the first conduction type is p-type, and the third conductor is comprised of titanium nitride.

5. A semiconductor device according to claim 4,
wherein the second conductor is a film mainly comprised of aluminum.

6. A semiconductor device according to claim 1,
wherein the first conduction type is p-type, and the third conductor is a conductor mainly comprised of titanium or cobalt, or a conductor mainly comprised of a compound of titanium or cobalt.

7. A semiconductor device according to claim 6,
wherein the second conductor is a film mainly comprised of aluminum.

8. A semiconductor device according to claim 1,
wherein the first conduction type is n-type and the third conductor is a conductor mainly comprised of cobalt, nickel or platinum, or a conductor mainly comprised of a compound of cobalt, nickel or platinum.

9. A semiconductor device according to claim 8,
wherein the second conductor is a film mainly comprised of aluminum.

10. A semiconductor device according to claim 1,
wherein the first conduction type is p-type and the third conductor is a conductor mainly comprised of chromium or molybdenum, or a conductor mainly comprised of a compound of chromium or molybdenum.

11. A semiconductor device according to claim 1,
wherein the first conduction type is p-type, the second conductor is a film mainly comprised of aluminum and the third conductor is a conductor mainly comprised of a chromium compound.

12. A semiconductor device comprising:
(a) a MISFET formed in a semiconductor substrate, including:
  (a1) a gate portion comprising a first conductor formed by way of an insulation film on the semiconductor substrate;
  (a2) a source portion comprising a semiconductor region of a first conduction type formed on the semiconductor substrate at least on one side of the gate portion;
  (a3) a drain portion comprising a semiconductor region of a first conduction type formed to a rear face of the semiconductor substrate; and
  (a4) a semiconductor region of a second conduction type opposite to the first conduction type arranged between the source portion and the drain portion, and
(b) a conductive portion formed above the semiconductor substrate and in contact with the source portion and the semiconductor region of the second conduction type, including:
  (b1) a second conductor; and
  (b2) a third conductor arranged between the second conductor and the semiconductor substrate,
(c) wherein the contact resistance between the source portion and the conductive portion is higher than the contact resistance between the semiconductor region of the second conduction type and the conductive portion.

13. A semiconductor device according to claim 12,
wherein the conductive portion is formed in a trench in the semiconductor substrate.

14. A semiconductor device according to claim 12,
wherein the first conduction type is n-type, the second conductor is a film mainly comprised of aluminum and the third conductor is comprised of molybdenum silicide.

15. A semiconductor device according to claim 12,
wherein the first conduction type is p-type, and the third conductor is comprised of titanium nitride.

16. A semiconductor device comprising:
(a) a MISFET formed in a semiconductor substrate, including:
  (a1) a gate portion comprising a first conductor formed by way of an insulation film on the semiconductor substrate;
  (a2) a source portion and a drain portion comprising a semiconductor region of a first conduction type formed in the semiconductor substrate on both sides of the gate portion; and
  (a3) a semiconductor region of a second conduction type opposite to the first conduction type arranged between the source portion and the drain portion, and
(b) a conductive portion formed above the semiconductor substrate and in contact with the source portion or the drain portion and the semiconductor region of the second conduction type, including:
  (b1) a second conductor; and
  (b2) a third conductor arranged between the second conductor and the semiconductor substrate,
(c) wherein the contact resistance between the source portion or the drain portion and the conductive portion is higher than the contact resistance between the semiconductor region of the second conduction type and the conductive portion.

17. A semiconductor device according to claim 16,
wherein, the gate portion comprises the first conductor formed by way of the insulation film in a trench formed in the semiconductor substrate.

18. A semiconductor device comprising:
(a) a MISFET formed in a semiconductor substrate, including:
  (a1) a gate portion comprising a first conductor formed in a trench in the semiconductor substrate;
  (a2) a source portion comprising a first semiconductor region of a first conduction type in contact with side walls of the gate portion;
  (a3) a drain portion comprising a second semiconductor region of the first conduction type formed to a rear face of the semiconductor substrate; and
  (a4) a third semiconductor region of a second conduction type opposite to the first conduction type arranged between the source portion and the drain portion, and
(b) a conductive portion formed above the semiconductor substrate in contact with the source portion and the third semiconductor region of the second conduction type, including:
  (b1) a second conductor; and
  (b2) a third conductor arranged between the second conductor and the semiconductor substrate,
(c) wherein the barrier height between the first semiconductor region and the third conductor is higher than a barrier height between the first semiconductor region and titanium tungsten in a case where the first conduction type is an n-type, and
wherein a barrier height between the first semiconductor region and third conductor is lower than the barrier height between the first semiconductor region and the titanium tungsten in a case where the first conduction type is a p-type.

19. A semiconductor device according to claim 18,
wherein the conductive portion is formed in another trench in the semiconductor substrate.

20. A semiconductor device according to claim 18, wherein the semiconductor substrate comprises silicon, the first conduction type is n-type, the second conductor is a film mainly comprised of aluminum, and the third conductor comprises molybdenum silicide.

21. A semiconductor device according to claim 18, wherein the semiconductor substrate comprises silicon, the first conduction type is p-type, and the third conductor comprises titanium nitride.

22. A semiconductor device according to claim 18, wherein the semiconductor substrate comprises silicon, the first conduction type is p-type and the third conductor is a conductor mainly comprised of titanium or cobalt or a conductor mainly comprised of a compound of titanium or cobalt.

23. A semiconductor device according to claim 18, wherein the semiconductor substrate comprises silicon, the first conduction type is n-type, and the third conductor is a conductor mainly comprised of cobalt, nickel or platinum or a conductor mainly comprised of a compound of cobalt, nickel or platinum.

24. A semiconductor device according to claim 18, wherein the semiconductor substrate comprises silicon, the first conduction type is p-type, and the third conductor is a conductor mainly comprised of chromium or molybdenum, or a conductor mainly comprised of a compound of chromium or molybdenum.

25. A semiconductor device comprising:
(a) a MISFET formed in a semiconductor substrate, including:
   (a1) a gate portion comprising a first conductor formed by way of an insulation film on the semiconductor substrate;
   (a2) a source portion comprising a first semiconductor region of a first conduction type formed on the semiconductor substrate at least on one side of the gate portion;
   (a3) a drain portion comprising a second semiconductor region of a first conduction type formed to a rear face of the semiconductor substrate; and
   (a4) a semiconductor region of a second conduction type opposite to the first conduction type arranged between the source portion and the drain portion, and
(b) a conductive portion formed above the semiconductor substrate and in contact with the source portion and the semiconductor region of the second conduction type, including:
   (b1) a second conductor; and
   (b2) a third conductor arranged between the second conductor and the semiconductor substrate,
(c) wherein a barrier height between the first semiconductor region and the third conductor is higher than the barrier height between the first semiconductor region and titanium tungsten in a case where the first conduction type is n-type, and
wherein a barrier height between the first semiconductor region and the third conductor is lower than a barrier height between the first semiconductor region and titanium tungsten in a case where the first conduction type is p-type.

26. A semiconductor device according to claim 25, wherein the conductive portion is formed in a trench in the semiconductor substrate.

27. A semiconductor device according to claim 25, wherein the semiconductor substrate comprises silicon, the first conduction type is n-type, the second conductor is a film mainly comprised of aluminum, and the third conductor comprises molybdenum silicide.

28. A semiconductor device according to claim 25, wherein the semiconductor substrate comprises silicon, the first conduction type is p-type, and the third conductor comprises titanium nitride.

29. A semiconductor device comprising;
(a) a MISFET formed in a semiconductor substrate, including:
   (a-1) a gate portion comprising a first conductor formed by way of an insulation film on the semiconductor substrate;
   (a-2) a source portion and a drain portion respectively comprising first and second semiconductor regions of a first conduction type formed in the semiconductor substrate, the source portion being formed on both sides of the gate portion; and
   (a-3) a semiconductor region of a second conduction type opposite to the first conduction arranged between the source portion and the drain portion, and
(b) a conductive portion formed above the semiconductor substrate and in contact with the source portion and the semiconductor region of the second conduction type, including:
   (b-1) a second conductor; and
   (b-2) a third conductor arranged between the second conductor and the semiconductor substrate,
(c) wherein a barrier height between the first semiconductor region and the third conductor is higher than a barrier height between the first semiconductor region and titanium tungsten in a case where the first conduction type is n-type, and
wherein a barrier height between the first semiconductor region and the third conductor is lower than a barrier height between the first semiconductor region and titanium tungsten in a case where the first conduction type is p-type.

30. A semiconductor device according claim 29, wherein the gate portion comprises the, first conductor formed by way of the insulation film in a trench formed in the semiconductor substrate.

31. A semiconductor device comprising:
(a) a MISFET formed in a semiconductor substrate, including:
   (a1) a gate portion comprising a first conductor formed in a trench in the semiconductor substrate;
   (a2) a source portion comprising a first semiconductor region of a first conduction type in contact with side walls of the gate portion;
   (a3) a drain portion comprising a second semiconductor region of the first conduction type formed to a rear face of the semiconductor substrate; and
   (a4) a semiconductor region of a second conduction type opposite to the first conduction type arranged between the source portion and the drain portion, and
(b) a conductive portion formed in another trench in the semiconductor substrate and in contact with the source portion and the semiconductor region of the second conduction type, including:
   (b1) an aluminum film; and
   (b2) a molybdenum suicide film arranged between the aluminum film and the semiconductor substrate.

32. A semiconductor device comprising:
(a) a MISFET formed in a semiconductor substrate, including:
   (a1) a gate portion comprising a first conductor formed in a trench in the semiconductor substrate;

(a2) a source portion comprising a first semiconductor region of a first conduction type in contact with side walls of the gate portion;

(a3) a drain portion comprising a second semiconductor region of the first conduction type formed to a rear face of the semiconductor substrate; and (a4) a semiconductor region of a second conduction type opposite to the first conduction type arranged between the source portion and the drain portion, and (b) a conductive portion formed in another trench in the semiconductor substrate and in contact with the source portion and the semiconductor region of the second conduction type, including:

(b1) an aluminum film; and (b2) a titanium nitride film arranged between the aluminum film and the semiconductor substrate.

33. A semiconductor device comprising:

(a) an n-channel type MISFET formed in a first semiconductor substrate, including:

(a-1) a first gate portion comprising a first conductor formed in a trench in the first semiconductor substrate;

(a-2) a first source portion comprising a first n-type semiconductor region in contact with side walls of the first gate portion;

(a-3) a first drain portion formed to a rear face of the first semiconductor substrate and comprising a second n-type semiconductor region; and (a-4) a first p-type semiconductor region arranged between the first source portion and the first drain portion, and (b) a first conductive portion formed above the first semiconductor substrate and in contact with the first source portion and the first p-type semiconductor region, including:

(b-1) a first aluminum film; and (b-2) a molybdenum silicide film arranged between the first aluminum film and the first semiconductor substrate, (c) a p-channel type MISFET formed in a second semiconductor substrate, including:

(c-1) a second gate portion comprising a first conductor formed in another trench in the second semiconductor substrate;

(c-2) a second source portion comprising a second p-type semiconductor region in contact with side walls of the second gate portion;

(c-3) a second drain portion formed on a rear face of the second semiconductor substrate and comprising a third p-type semiconductor region; and (c-4) a third n-type semiconductor region arranged between the second source portion and the second drain portion, and (d) a second conductive portion formed above the second semiconductor substrate arid in contact with the second source portion and the third n-type semiconductor region, including:

(d-1) a second aluminum film; and (d-2) a titanium nitride film arranged between the second aluminum film and the second semiconductor substrate.

34. A semiconductor device comprising:

(a) an n-channel type MISFET formed in a first semiconductor substrate, including:

(a-1) a first gate portion comprising a first conductor formed in a trench in the first semiconductor substrate;

(a-2) a first source portion comprising a first n-type semiconductor region in contact with side walls of the first gate portion;

(a-3) a first drain portion formed on a rear face of the first semiconductor substrate and comprising a second n-type semiconductor region; and (a-4) a first p-type semiconductor region arranged between the first source portion and the first drain portion, and (b) a first conductive portion formed above the first semiconductor substrate and in contact with the first source portion and the first p-type semiconductor region, including:

(b-1) a second conductor; and (b-2) a third conductor arranged between the second conductor and the first semiconductor substrate, (c) a p-channel type MISFET formed in a second semiconductor substrate, including:

(c-1) a second gate portion comprising a first conductor formed in another trench in the second semiconductor substrate;

(c-2) a second source portion comprising a second p-type semiconductor region in contact with side walls of the second gate portion;

(c-3) a second drain portion formed on a rear face of the second semiconductor substrate and comprising a third p-type semiconductor region; and (c-4) a third n-type semiconductor region arranged between the second source portion and the second drain portion, and (d) a second conductive portion formed above the second semiconductor substrate and in contact with the second source portion and the third n-type semiconductor region, including:

(d-1) a second conductor; and (d-2) a fourth conductor arranged between the second aluminum film and the second semiconductor substrate, (e) wherein the third conductor and the fourth conductor are different from each other.

35. A semiconductor device according to claim 34, (f) wherein a barrier height between the first n-type semiconductor region and the third conductor is different from a barrier height between the second p-type semiconductor region and the fourth conductor.

36. A semiconductor device according to claim 34, wherein the first and the second semiconductor substrates are comprised of n-silicon, and a barrier, height between the n-silicon and the third conductor is higher than a barrier height between the n-silicon and the fourth conductor.

37. A semiconductor device comprising an n-channel type MISFET and a p-channel type MISFET, (a) wherein a first wiring layer is formed in a region for forming the n-channel type MISFET, (b) wherein the first wiring layer is connected with the semiconductor substrate in the region for forming the n-channel type MISFET by way of a first barrier layer comprising a first conductor, and a first gate portion of the n-channel type MISFET is formed in a trench on the semiconductor substrate, (c) wherein a second wiring layer is formed in a region for forming the p-channel type MISFET, and (d) wherein the second wiring layer is connected with the semiconductor substrate in the region for forming the p-channel type MISFET by way of a second barrier layer comprising a second conductor different from the first conductor.

38. A semiconductor device according to claim 37, wherein a second gate portion of the p-channel type MISFET is formed in another trench on the semiconductor substrate.

* * * * *